(12) United States Patent
Nam et al.

(10) Patent No.: US 12,356,877 B2
(45) Date of Patent: Jul. 8, 2025

(54) METAL-OXIDE INFILTRATED ORGANIC-INORGANIC HYBRID RESISTIVE RANDOM-ACCESS MEMORY DEVICE

(71) Applicants: Brookhaven Science Associates, LLC, Upton, NY (US); The Research Foundation for The State University of New York, Albany, NY (US)

(72) Inventors: Chang-Yong Nam, Stony Brook, NY (US); Ashwanth Subramanian, Tualatin, OR (US); Nikhil Tiwale, Medford, NY (US); Kim Kisslinger, Manorville, NY (US)

(73) Assignees: Brookhaven Science Associates, LLC, Upton, NY (US); The Research Foundation for The State University of New York, Albany, NY (US)

( * ) Notice: Subject to any disclaimer, the term of this patent is extended or adjusted under 35 U.S.C. 154(b) by 575 days.

(21) Appl. No.: 17/854,529

(22) Filed: Jun. 30, 2022

(65) Prior Publication Data

US 2023/0006133 A1    Jan. 5, 2023

Related U.S. Application Data

(60) Provisional application No. 63/217,367, filed on Jul. 1, 2021.

(51) Int. Cl.
*H10N 70/00* (2023.01)
*H10B 63/00* (2023.01)
*H10N 70/20* (2023.01)

(52) U.S. Cl.
CPC .......... *H10N 70/881* (2023.02); *H10B 63/80* (2023.02); *H10N 70/011* (2023.02); *H10N 70/245* (2023.02); *H10N 70/8416* (2023.02)

(58) Field of Classification Search
CPC .. H10N 70/881; H10N 70/011; H10N 70/245; H10N 70/8416; H10B 63/80
See application file for complete search history.

(56) References Cited

U.S. PATENT DOCUMENTS

2021/0202836 A1* 7/2021 Kajiro ................. H10N 70/826

OTHER PUBLICATIONS

Wu et al., A Polymer-Electrolyte-Based Atomic Switch, 2010 (Year: 2010).*

(Continued)

*Primary Examiner* — Syed I Gheyas
*Assistant Examiner* — Casey Paul Boatman
(74) *Attorney, Agent, or Firm* — Dorene Price

(57) ABSTRACT

A resistive random access memory (RRAM) device includes a plurality of memory cells, each of at least a subset of the memory cells including first and second electrodes and an organic thin film compound mixed with silver perchlorate ($AgClO_4$) salt as a base layer that is incorporated with a prescribed quantity of inorganic metal oxide molecules using vapor-phase infiltration (VPI), the base layer being formed on an upper surface of the first electrode and the second electrode being formed on an upper surface of the base layer. Resistive switching characteristics of the RRAM device are controlled as a function of a concentration of $AgClO_4$ salt in the base layer. A variation of device switching parameters is controlled as a function of an amount of infiltrated metal oxide molecules in the base layer.

18 Claims, 19 Drawing Sheets

(56) References Cited

OTHER PUBLICATIONS

Ye, Effects of Residual Solvent Molecules Facilitating the Infiltration Synthesis of ZnO in a Nonreactive Polymer, 2017 (Year: 2017).*

Dusoe, Ultrahigh Elastic Strain Energy Storage in Metal-Oxide-Infiltrated Patterned Hybrid Polymer Nanocomposites, 2017 (Year: 2017).*

Nam, Reduced Stochastic Resistive Switching in Organic-Inorganic Hybrid Memristors by Vapor-Phase Infiltration, 2022 (Year: 2022).*

Ercan, E., et al., "A Redox-Based Resistive Switching Memory Device Consisting of Organic-Inorganic Hybrid Perovskite/Polymer Composite Thin Film" Adv Electron Mater vol. 3 (2017) 1700344 (8 pages.).

Peng, Q., et al., "A Route to Nanoscopic Materials Via Sequential Infiltration Synthesis on Block Copolymer Templates" ACS Nano (2011) vol. 5, No. 6, pp. 4600-4606.

Samanta, S., et al., "Bipolar Resistive Switching and Synaptic Characteristics Modulation at Sub-mA Current Level Using Novel Ni/SiOx/W Cross-Point Structure", J Alloys and Compounds (2019) vol. 805 pp. 915-923.

Tsuruoka, T., et al., "Effects of Moisture on the Switching Characteristics of Oxide-Based, Gapless-Type Atomic Switches" Adv Funct Mater, vol. 22, pp. 70-77 (2012).

Ye, X, et al., "Effects of Residual Solvent Moleculres Facilitating the Infiltration Synthesis of ZnO in a Nonreactive Polymer" Chem Mater, vol. 29 (2017) pp. 4535-4545.

Mohapatra, S., et al., "Effects of Temperature and Ambient Pressure on the Resistive Switching Behaviour of Polymer-Based Atomic Switches" J Mater Chem C, (2015) vol. 3, pp. 5715-5720. 1398-1409.

Kim, S., "Flexible Crossbar-Structured Resistive Memory Arrays on Plastic Substrates Via Inorganic-Based Laser Lift-Off" Adv Mater, (2014) vol. 26, pp. 7480-7487.

Yun, Y., et al. "Interface Engineering in Epitaxial Growth of Layered Oxides Via a Conducting Layer Insertion" Applied Phys Lett, (2015), vol. 107 011602 (5 pages).

Wang, Z., et al., "Resistive Switching Materials for Information Processing" Nature Reviews Mater, vol. 5 (2020) pp. 173-195.

Lorenzi, P, et al., "Role of the Electrode Metal, Waveform Geometry, Temperature, and Postdeposition Treatment on Set and Reset of HfO2-Based Resistive Random Access Memory 1R-Cells: Experimental Aspects" J Vac Sci Technol B (2015), vol. 33 01A107 (6 pages).

Mazur, T., et al., "Synaptic Plasticity, Metaplasticity and Memory Effects in Hybrid Organic-Inorganic Bismuth-Based Materials" Nanoscale, vol. 11 (2019) pp. 1080-1090.

Dusoe, K., et al., "Ultrahigh Elastic Strain Energy Storage in Metal-Oxide-Infiltrated Patterned Hybrid Polymer Nanocomposites" Nano Lett, (2017) vol. 17 7416-7423.

Kim, M-K., et al., "Ultralow Power Consumption Flexible Biomemristors" ACS Appl Mater Interfaces (2018), vol. 10, pp. 10280-10286.

Roy, K., et al., "Towards Spike-Based Machine Intelligence With Neuromorphic Computing" Nature (2019), vol. 575, pp. 607-617.

* cited by examiner

FIG. 9C
FIG. 9D
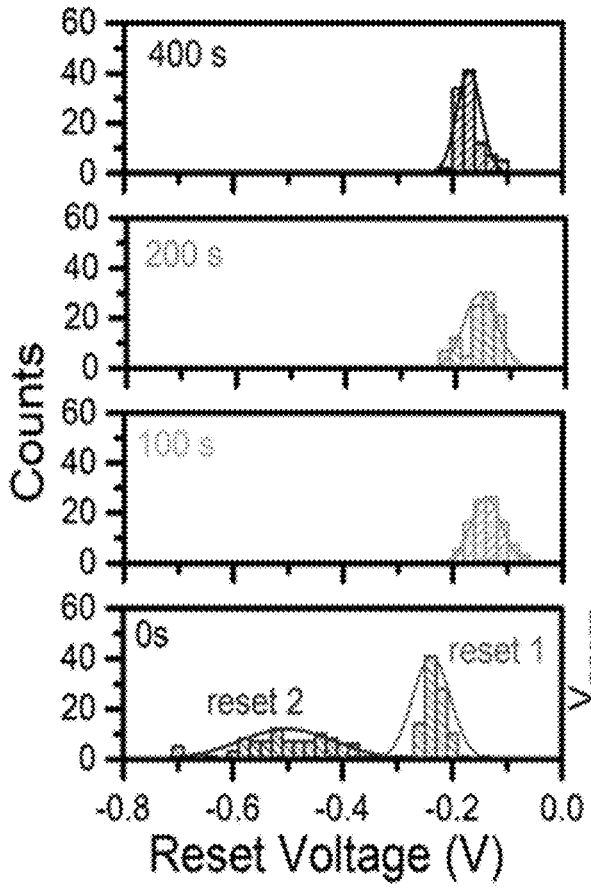
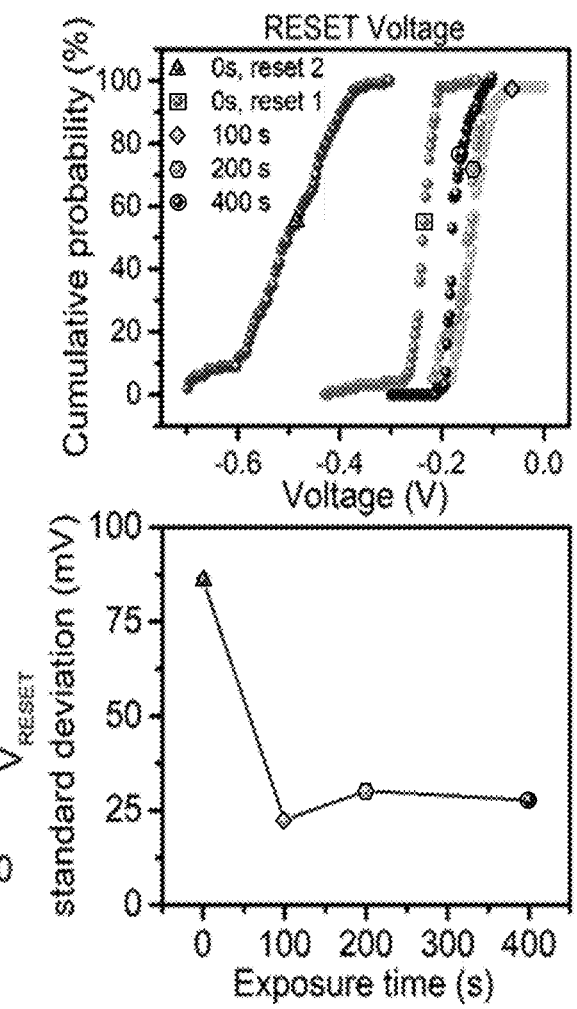

PATTERNED SU8 REGION

METAL-OXIDE INFILTRATED ORGANIC-INORGANIC HYBRID RESISTIVE RANDOM-ACCESS MEMORY DEVICE

CROSS-REFERENCE TO RELATED APPLICATIONS

This application claims the benefit of U.S. Provisional Patent Application No. 63/217,367, filed on Jul. 1, 2021, entitled "Metal-oxide Infiltrated Organic-inorganic Hybrid Resistive Random-access Memory Device," the disclosure of which is incorporated by reference herein in its entirety for all purposes.

STATEMENT OF GOVERNMENT RIGHTS

The present application was made with government support under contract number DE-SC0012704 awarded by the United States Department of Energy. The United States government has certain rights in the invention.

BACKGROUND

The present invention relates generally to the electrical, electronic and computer arts, and, more particularly, to resistive random-access memory devices.

Resistive random-access memory, also known as RRAM or ReRAM, is a form of nonvolatile storage that operates by changing the resistance of a specially formulated solid dielectric material; conductive bridge random access memory (CBRAM) and programmable metallization cell (PMC) are perhaps the more general and well-known forms of RRAM or ReRAM. An RRAM device contains a storage element called a memristor (a contraction of "memory resistor") whose resistance varies as a function of the voltage imposed across it.

Normally, a dielectric material does not conduct an electric current. In fact, dielectric substances are commonly employed in capacitors for the purpose of preventing the flow of current and maintaining separation of electric charge poles. However, if the dielectric material is subjected to a high enough voltage, it will suddenly conduct due to a phenomenon known as dielectric breakdown. In a conventional dielectric material, dielectric breakdown causes permanent damage and failure of the associated component. In a memristor, however, a controlled, conductive pathway is temporarily formed whose behavior is dependent on the material employed.

In one form of memristor, an applied voltage causes the dielectric medium to acquire microscopic conductive paths called filaments. The filaments appear as a result of various phenomena such as metal migration or physical defects. Once a filament appears, it can be broken or reversed by the application of a different external voltage. The controlled formation and destruction of a filament allows for a change in resistance of the memristor. Another form of memristor uses an applied voltage to cause a change in the state of a material (such as chalcogenide or certain metal oxide materials), rapidly flipping the material from a conducting phase to a non-conducting (or less conducting) phase, which results in a corresponding and measurable change in the resistance of the material. Regardless of the form of memristor employed, the change in resistance between states of the material can be sensed and arbitrarily assigned to different logical states for storing digital data.

Despite the advantages provided by RRAM devices, significant problems with RRAM devices include stochasticity in the operating voltages (set and reset voltages) and the resistance states (high-resistance state (HRS) and low-resistance state (LRS)), poor reliability (endurance and retention), and poor reproducibility (chip-to-chip and device-to-device variability) fundamentally caused by the random growth and rupture of the conductive filaments. In hybrid RRAM cells, the stochasticity issues are primarily associated with defects introduced during the fabrication process, especially originating from the poor size distribution and non-homogeneous distribution of the inorganic elements within the organic matrix, causing a non-uniform electric field and thus affecting the underlying electrochemical processes. These disadvantages, along with other limitations such as processing complexity, high fabrication cost, and high power consumption, continue to restrict the widespread use of RRAM devices as a viable memory storage solution.

SUMMARY

The present invention, as manifested in one or more embodiments, beneficially improves the performance (e.g., set and reset switching characteristics) of organic-based RRAM devices. More particularly, one or more embodiments of the invention provide a novel organic-inorganic hybrid RRAM media whose bipolar switching characteristics and stochasticity can be selectively controlled by certain process parameters, such as vapor-phase infiltration (VPI), an ex situ hybridization technique derived from atomic layer deposition. In one or more embodiments, hybrid RRAM devices based on an $AlO_x$-infiltrated SU-8 hybrid switching medium feature facile tenability of device switching voltages, off-state current, and on-off ratio by adjusting an amount of infiltrated $AlO_x$ in the hybrid switching medium. Furthermore, embodiments of the invention achieve a significant reduction in the stochastic, cycle-to-cycle variations of switching parameters enabled at least in part by $AlO_x$ infiltration, driven by infiltration-induced changes in mechanical, dielectric, and chemical properties of organic media and their influence on the dimension and information characteristics of conductive filaments. Additionally, embodiments of the invention beneficially demonstrate multi-level analog switching capabilities potentially useful for neuromorphic computing applications.

In accordance with a first aspect of one or more embodiments of the invention, an RRAM device includes a plurality of memory cells, each of at least a subset of the memory cells including first and second electrodes, and an organic thin film compound mixed with silver perchlorate ($AgClO_4$) salt as a base layer that is incorporated with a prescribed quantity of inorganic metal oxide molecules using VPI, the base layer being formed on an upper surface of the first electrode and the second electrode being formed on an upper surface of the base layer. Resistive switching characteristics of the RRAM device are controlled as a function of a concentration of $AgClO_4$ salt in the base layer. A variation of device switching parameters is controlled as a function of an amount of infiltrated metal oxide molecules in the base layer.

In one or more embodiments, the base layer is an SU-8: $AgClO_4$ matrix. A variation of RRAM device switching parameters, including $V_{SET}$ and $V_{RESET}$, is significantly reduced by incorporating molecular $AlO_x$ network by VPI in the SU-8:$AgClO_4$ matrix. Furthermore, control of the device switching parameters is beneficially enabled by selectively adjusting (i.e., tuning) the amount of infiltrated $AlO_x$.

In one or more embodiments, the RRAM device is well-suited for use as an artificial, analog synaptic switching device for low-power neuromorphic computing applications.

In accordance with a second aspect according to one or more embodiments of the invention, a method for forming an RRAM cell includes: forming a first electrode on at least a portion of an upper surface of a substrate; forming an organic thin film compound mixed with $AgClO_4$ salt as a base layer on at least a portion of an upper surface of the first electrode; incorporating the base layer with a prescribed quantity of inorganic metal oxide molecules using VPI; forming a second electrode on at least a portion of an upper surface of the base layer; controlling resistive switching characteristics of the RRAM device as a function of a concentration of $AgClO_4$ salt in the base layer; and controlling a variation of device switching parameters as a function of an amount of infiltrated metal oxide molecules in the base layer.

Techniques of the present invention can provide substantial beneficial technical effects. By way of example only and without limitation, an RRAM according to one or more embodiments of the invention may provide one or more of the following advantages:
- predictability of device operating voltages (including set and reset voltages) and high-resistance and low-resistance operating states;
- reduced variance in device switching characteristics and controllable switching parameters;
- improved device reliability, including device endurance and data retention;
- enhanced reproducibility, in terms of reduced chip-to-chip and device-to-device variability;
- improved size distribution and homogeneous distribution of inorganic elements within an organic matrix of the RRAM switching medium, thereby providing a more uniform electric field in the hybrid RRAM device;
- multi-level analog switching characteristics for neuromorphic device operation;
- demonstrated lithographic patternability; and
- reduced operational power.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 9A and 9C are histograms depicting exemplary SET and RESET voltage variation, respectively, for devices having $AlO_x$ infiltration times varying between 0 s and 400 s, according to one or more embodiments of the present invention FIGS. 9B and 9D are graphs depicting exemplary cumulative probability distribution and corresponding standard deviation in SET voltage and RESET voltage, respectively, for devices having $AlO_x$ infiltration times varying between 0 s and 400 s, according to one or more embodiments of the present invention;

Figure 1A:
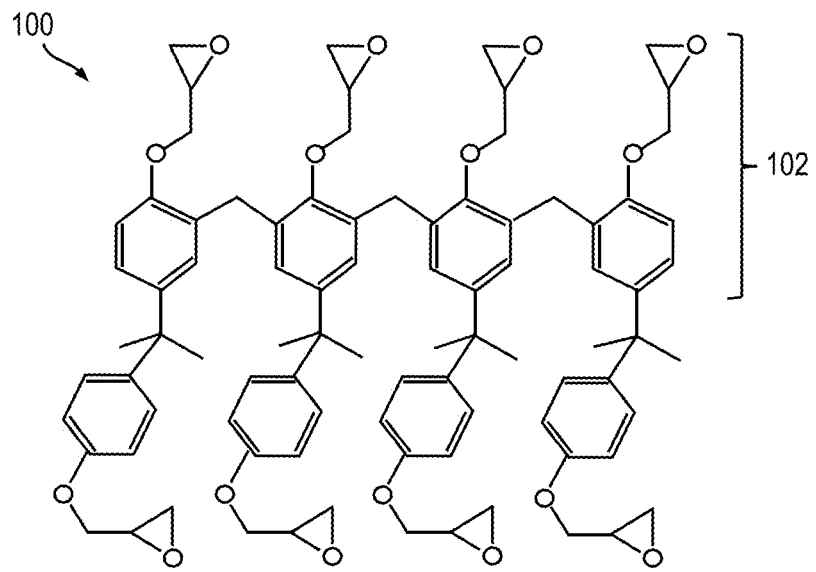
FIG. 1A is an organic chemistry diagram depicting an SU-8 molecule.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of illustrative metal-oxide infiltrated organic-inorganic hybrid RRAM devices having enhanced performance and fabrication methods, suitable for use in a neuromorphic computing environment, among other applications. It is to be appreciated, however, that embodiments of the invention are not limited to the specific device(s) and/or methods illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

Although the overall fabrication method and structures formed thereby are considered to be entirely novel, certain individual processing steps required to fabricate RRAM devices according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties for all purposes. It is emphasized that while some individual processing steps may be set forth herein, those steps are merely illustrative, and it is contemplated that one skilled in the art may be familiar with several equally suitable alternatives that would also fall within the scope of the present invention.

It is to be understood that the various layers and/or regions shown in the accompanying figures are not necessarily drawn to scale. Furthermore, one or more material layers of a type commonly used in such integrated circuit devices may not be explicitly shown in a given figure for clarity of description. This does not imply, however, that the material layer(s) not explicitly shown are omitted in the actual device.

Embodiments of the invention provide organic-inorganic hybrid composite thin films comprising an organic thin film layer infiltrated with inorganic metal oxide molecules. The nanocomposite thin film can be used as an active layer for RRAM devices that feature reduced variance in device switching characteristics, controllable switching parameters by adjusting an amount of infiltrated inorganic materials, multi-level analog switching characteristics for neuromorphic device operation, and/or demonstrated lithographic patternability, among other beneficial features and advantages.

Resistive random-access memory (RRAM or ReRAM), also known as conductive bridge random-access memory (CBRAM), also known as programmable metallization cell (PMC), is a type of memory device which relies on electrochemical processes to control the movement of nanoscale quantities of metal/metal ions across a dielectric/solid electrolyte medium. A standard RRAM cell has a simple two-terminal "top electrode/solid electrolyte/bottom electrode" or a metal-insulator-metal (MIM) sandwich structure and switches between a high resistance state (HRS) and a low resistance state (LRS) to store, retrieve and erase information (also known as resistive switching). The top electrode typically comprises an electrochemically active material, such as silver (Ag), copper (Cu), or nickel (Ni), and the bottom electrode comprises an electrochemically inert material, such as platinum (Pt), gold (Au), tungsten (W), or tantalum (Ta). A material class for the dielectric film or the solid electrolyte is preferably comprised of oxides, higher chalcogenides (including glasses), semiconductors, as well as organic compounds including polymers. Key desirable attributes of RRAM devices include low voltage and current, rapid write and erase, good retention and endurance, and the ability for the storage cells to be physically scaled to a few tens of nanometers (nm) with suitable patterning processes.

More recently, organic and organic-inorganic hybrid materials have been given much attention as a switching medium in RRAM devices, primarily because they can display tunable mixed material properties and offer various advantages, such as flexibility, simple fabrication process, disposability, biocompatibility, and tunable memory properties, typically achieved by changing the inorganic composition within the organic polymer matrix.

Despite these advantages, major problems with RRAM devices include stochasticity in the operating voltages (set and reset voltages) and the resistance states (HRS and LRS), poor reliability (endurance and retention), and reproducibility (chip-to-chip and device-to-device variation), which are fundamentally caused by the random growth and rupture of the conductive filament. In hybrid RRAM cells, the stochasticity issues are primarily associated with defects introduced during the fabrication process, especially originating from poor size distribution and non-homogeneous distribution of the inorganic elements within the organic matrix, causing non-uniform electric fields and, thus, affecting the underlying electrochemical processes. Adoption of a suitable strategy to improve the control over the structural, physical, and chemical properties of hybrid switching media would enable high-performance hybrid RRAMs with reliable and predictable memory characteristics.

To improve the various device performance issues, several strategies have been explored in various inorganic switching mediums to control and confine the conductive filament in the switching layer to make performance of RRAM more reliable and practical. Through electrode engineering, RRAM devices can effectively enhance the device-to-device uniformity and reduce the distribution of the performance parameters. For instance, as described in Q. Liu, et al., "Controllable Growth of Nanoscale Conductive Filaments in Solid-Electrolyte-Based ReRAM by Using a Metal Nanocrystal Covered Bottom Electrode," ACS Nano 2010, 4 (10), pp. 6162-6168, which is incorporated by reference herein in its entirety, the surface of the bottom Pt electrode of a $Ag/ZrO_2$—CuNC/Pt memory device was decorated so as to control the silver filament formation along the direction of the Cu metal nanocluster (NC). This device, compared to the device with no CuNC (i.e., $Ag/ZrO_2/Pt$), showed much narrower set and reset voltage distribution. Shin et al. (K.-Y Shin, et al., "Controllable Formation of Nanofilaments in Resistive Memories via Tip-Enhanced Electric Fields," Advanced Electronic Materials 2016, 2 (10), the disclosure of which is incorporated by reference herein in its entirety) fabricated a pyramid tip structured $Ag/Al_2O_3/Pt$ resistive switching device in which the Ag filament formation was spatially controlled near the pyramid tip. The devices with this structure exhibited low set and reset voltage, higher endurance and retention compared to the conventional geometry device. Likewise, You et al. (B. K. You, et al., "Reliable Control of Filament Formation in Resistive Memories by Self-Assembled Nanoinsulators Derived from a Block Copolymer," ACS Nano 2014, 8 (9), pp. 9492-9502, the disclosure of which is incorporated by reference herein in its entirety) decorated insulating $SiO_2$ nanodots between the top Pt electrode and NiO switching medium using block copolymers for the $Pt/SiO_2/NiO/Ni$ RRAM device and reduced the standard deviation (SD) for set and reset by 77% and 60%, respectively, and the SD for HRS reduced drastically by 99% compared to the base device (Pt/NiO/Ni).

Another strategy that has been frequently implemented is doping the switching medium by either alloying, embedding nanoparticles, or inserting a two-dimensional (2D) layer into the medium to improve the device performance. Yeon et al. (H. Yeon, et al., "Alloying Conducting Channels for Reliable Neuromorphic Computing," Nat Nanotechnol 2020, 15 (7), pp. 574-579, the disclosure of which is incorporated by reference herein in its entirety) have reported dramatic reduction of set voltage temporal variation from 16.4% to 3.3% when doping Cu into silicon as the resistive switching medium. Au et al. (K. Au, et al., "Enhanced Resistive Switching Effect in Ag Nanoparticle Embedded $BaTiO_3$ Thin Films," J. Appl. Phys. 2013, 114 (2), the disclosure of which is incorporated by reference herein in its entirety) incorporated Ag nanoparticles into $BaTiO_3$ switching medium to increase the on/off ratio and decrease the switching voltage. Zhao et al. (X. Zhao, et al., "Confining Cation Injection to Enhance CBRAM Performance by Nanopore Graphene Layer," Small 2017, 13 (35), the disclosure of which is incorporated by reference herein in its entirety) used a nanopore graphene as an interlayer between the top Cu electrode and the $HfO_2$ switching medium to confine the formation of filaments and thus improved the uniformity of HRS current level.

Engineering strategies to physically constrain the conductive filament within channels in the switching medium has also been realized for improved RRAM-based neuromorphic computing and in-memory data processing. For instance, Choi et al. (Choi, S.; Tan, S. H.; Li, Z.; Kim, Y.; Choi, C.; Chen, P. Y.; Yeon, H.; Yu, S.; Kim, J., SiGe epitaxial memory for neuromorphic computing with reproducible high performance based on engineered dislocations. Nat Mater 2018, 17 (4), pp. 335-340, the disclosure of which is incorporated by reference herein in its entirety) demonstrated engineering the dislocations within epitaxially grown amorphous silicon switching medium by alloying with germanium (Ge) to physically constrain the filament growth within SiGe, which resulted in reducing the temporal variation in the set voltage to as low as 1.7% (from 28% for the undoped silicon medium).

However, while various strategies have been suggested and explored to improve the performance of inorganic-based RRAM memory devices, such investigations have been relatively limited for hybrid material-based RRAM devices. For instance, Hong et al. (J.-Y. Hong, et al., "A Facile Route for the Preparation of Organic Bistable Memory Devices Based on Size-controlled Conducting Polypyrrole Nanoparticles," Org. Electron. 2013, 14 (3), pp., 979-983, the disclosure of which is incorporated by reference herein in its entirety) have shown that the size of polypyrrole NPs embedded in PVA layers play a key role in affecting the charge trapping, and the devices with NPs larger than 60 nm exhibited poor memory performance due to charge leakage originated by rough surfaces. Kim et al. (S.-J. Kim, et al., "Control of Gold Nanoparticle-Protein Aggregates in Albumen Matrix for Configurable Switching Devices," *Adv. Mater. Interf.* 2018, 5 (9), the disclosure of which is incorporated by reference herein in its entirety) demonstrated that poor switching characteristics Albumen:Au NP due to Au NP agglomeration could result in poor switching performance and this could be improved by adding an additional poly(vinylpyrrolidone) (PVP) capping agent into the hybrid material which prevented the nanoparticle agglomeration inside the hybrid material to provide uniform switching properties.

The present invention, as manifested by one or more embodiments, relates to a novel RRAM device and fabrication method (i) that provides the ability to tune resistive switching across an organic compound such as SU-8, or other polymer compound or block copolymer (BCP), by changing the quantity of silver perchlorate ($AgClO_4$) salt concentration, (ii) that not only significantly suppresses the variation of device switching parameters, including $V_{SET}$ and $V_{RESET}$, but also enables their control by adjusting the amount of infiltrated $AlO_x$ by incorporating a molecular $AlO_x$ network by VPI into the SU-8:$AgClO_4$ matrix, and (iii) that provides an artificial, analog synaptic switching device that is well-adapted for low-power neuromorphic computing applications, among other important benefits. Each of these beneficial characteristics and features of the RRAM device according to one or more embodiments of the invention will be discussed in further detail herein below. The use of organic-inorganic hybrid materials generated by VPI as an active component media in electronic devices has been rarely attempted, much less been successfully implemented.

Figure 1B:
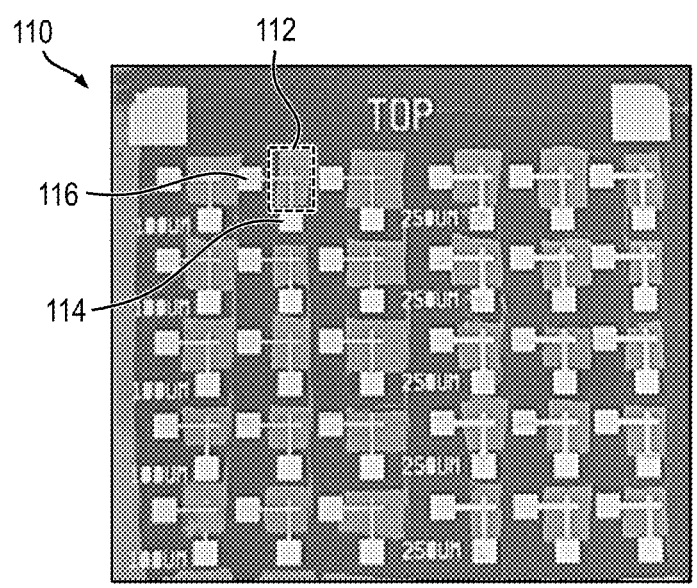
FIG. 1B is a top plan view depicting at least a portion of an exemplary memory device, according to one or more embodiments of the present invention.
Figure 1C:
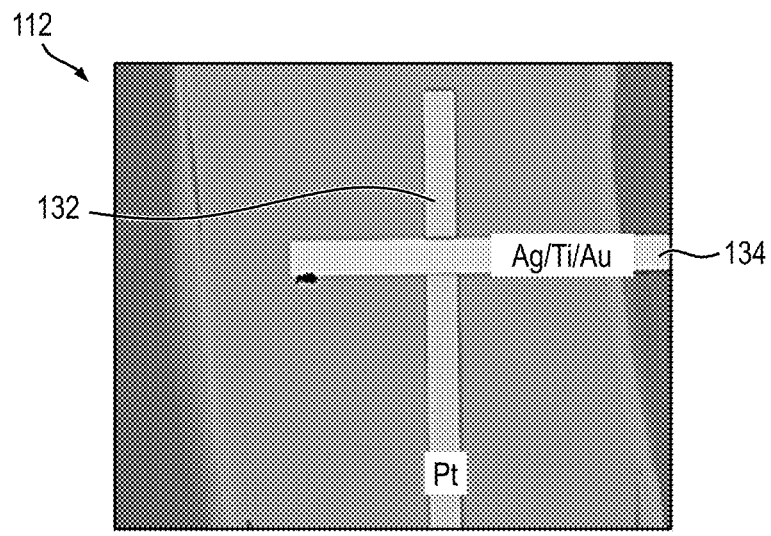
FIG. 1C is a top plan view depicting at least a portion of a $SU-8:AgClO_4$ device sandwiched between bottom (Pt) and top (Ag) electrodes, according to one or more embodiments of the present invention.
Figure 1D:
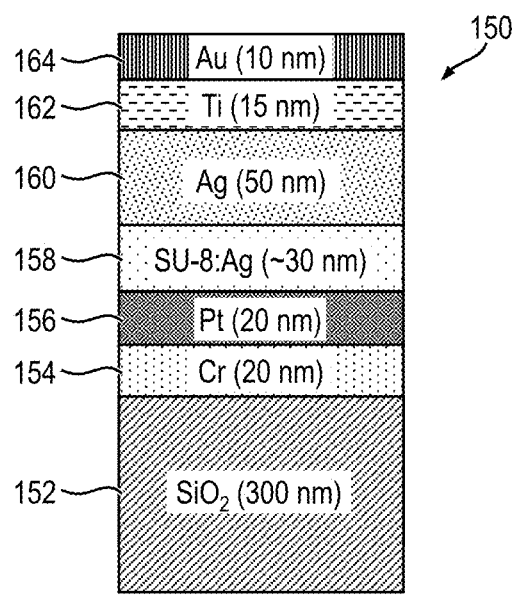
FIG. 1D is a cross-sectional view depicting at least a portion of a $SU-8:AgClO_4$ device, based on a cross-point, metal-insulator-metal (MIM) structure, sandwiched between bottom (Pt) and top (Ag) electrodes, according to one or more embodiments of the present invention.

FIGS. 1A-1D conceptually depict certain characteristics relating to an illustrative SU-8 device, according to one or more embodiments of the invention. Specifically, FIG. 1A is an organic chemistry diagram 100 depicting at least a portion of an illustrative SU-8 molecule which may be used in forming an RRAM, according to one or more embodiments of the invention; FIG. 1B is a top plan view optical image (e.g., scanning electron microscope (SEM) image) depicting at least a portion of an exemplary RRAM device including a plurality of individually accessible (i.e., addressable) SU-8-based RRAM cells arranged in a grid array, according to one or more embodiments of the invention; FIG. 1C is a zoomed-in top plan view optical image depicting a single one of the RRAM cells shown in FIG. 1B; and FIG. 1D is a cross-sectional view depicting material layers used in forming an illustrative RRAM cell, according to one or more embodiments of the invention.

Among the organic-based resistive switching devices, solid polymeric electrolyte (SPE) switching media generally display high resistance in natural form and an ability to support ionic transport under an applied voltage. In one or more embodiments, SU-8 is employed as a base switching medium, primarily for its ability to support ionic conduction and facile lithographic patterning. As apparent from the structural diagram 100 shown in FIG. 1A, SU-8 derives its name from the presence of eight epoxy groups 102; this is a statistical average per moiety. These epoxy groups 102 cross-link to impart the final structure. SU-8, which is typically used as a negative-tone photoresist compound, is composed of bisphenol-A novolac epoxy that is dissolved in an organic solvent (gamma-butyrolactone (GBL) or cyclopentanone, depending on the formulation) and up to 10 weight percent (wt %) of mixed triarylsulfonium hexafluoroantimonate salt as a photoacid generator.

With reference now to FIG. 1B, the illustrative hybrid RRAM device 110 includes a plurality of individual memory cells 112 arranged in a grid array. Each of the RRAM cells 112 includes a first contact 114 and a second contact 116 electrically connected to the bottom and top electrodes, respectively, of the RRAM cell for accessing the cell. A close-up view of a single illustrative hybrid RRAM cell 112 is shown in FIG. 1C. As apparent from FIG. 1C, the illustrative RRAM cell 112, in one or more embodiments, comprises a bottom electrode 132 that is formed of platinum (Pt), and a top electrode 134 formed as a multi-layer structure comprising silver, titanium and gold (Ag/Ti/Au). In one or more embodiments, the top electrode 134 is oriented substantially perpendicular to the bottom electrode 132. It is to be appreciated, however, that the RRAM cell 112 is not limited to the specific materials or arrangement of electrodes shown.

With reference now to FIG. 1D, a cross-sectional view depicts material layers used in forming an exemplary RRAM cell 150, according to one or more embodiments of the invention. By way of example only and without limitation, the illustrative RRAM cell 150 comprises a substrate 152, which may comprise silicon dioxide ($SiO_2$) or an alternative material. The substrate 152 may be formed having a thickness of about 300 nm, for example. A chromium (Cr) layer 154 is disposed on at least a portion of an upper surface of the substrate 152. The chromium layer 154 preferably has a thickness of about 20 nm in some embodiments. A platinum (Pt) layer 156 is then formed on at least a portion of an upper surface of the chromium layer 154. The platinum layer 156, which forms a bottom electrode of the RRAM cell 150, has a thickness of about 20 nm, in one or more embodiments. An SU-8/silver composite (e.g., SU-8:Ag or SU-8:$AgClO_4$) layer 158 is disposed (e.g., formed, deposited, coated, etc.) on at least a portion of an upper surface of the platinum layer 156. The SU-8/silver composite layer 158, which forms a switching medium of the RRAM cell 150 (i.e., a dielectric layer that facilitates switching), has a thickness of about 30 nm in some embodiments.

A top electrode is disposed (e.g., formed, deposited, coated, etc.) on at least a portion of an upper surface of the SU-8/silver composite layer 158. In this embodiment, the top electrode is formed as a multiple-layer structure comprising a silver (Ag) layer 160 formed on at least a portion of the upper surface of the SU-8/silver composite layer 158, a titanium (Ti) layer 162 formed on at least a portion of an upper surface of the silver layer, and a gold (Au) layer 164 formed on at least a portion of an upper surface of the titanium layer. The silver layer 160 has a thickness of about 50 nm, the titanium layer 162 has a thickness of about 15 nm, and the gold layer 164 has a thickness of about 10 nm. Thus, the SU-8:$AgClO_4$ device 150, based on a cross-point, metal/insulator/metal (MIM) structure, consists of 30 nm-thick SU-8:$AgClO_4$ media sandwiched between bottom Pt (ground) and top Ag electrodes. It is to be understood, however, that embodiments of the invention are not limited to any specific dimensions of the various layers forming the hybrid RRAM cell 150.

The efficacy of the base SU-8:$AgClO_4$ layer 158 without $AlO_x$ infiltration can be experimentally confirmed as an effective RRAM media. In one or more embodiments, as previously described in conjunction with FIG. 1D, the illustrative SU-8:$AgClO_4$ RRAM cell 150 is based on a cross-point, metal/insulator/metal (MIM) structure which consists of 30 nm-thick SU-8:AgClO$_4$ media layer 158 sandwiched between a bottom Pt electrode 156 (ground) and a top Ag electrode 160.

The resistive switching properties of SU-8:AgClO$_4$ as the media layer 158 were found to be strongly dependent on the doping concentration of AgClO$_4$ (e.g., 0, 5, 10 and 15 weight percent (wt %) with respect to SU-8, mixed in the SU-8 solution). FIGS. 2A-2D are graphs depicting experimental results of direct current (DC), cyclic current-voltage (I-V) sweep characteristics for an Ag/SU-8+AgClO$_4$/Pt RRAM cell with varying concentrations of AgClO$_4$ (with ±10 volts (V) applied to the top Ag electrode) at 250 mA current compliance. The thicker, dark grey curves in each of FIGS. 2A-2D denote the first sweep of each type of memory cell, while the thinner, light grey curves in FIGS. 2B-2C represent consecutive 99 sweeps after the first sweep.

Figure 2A:
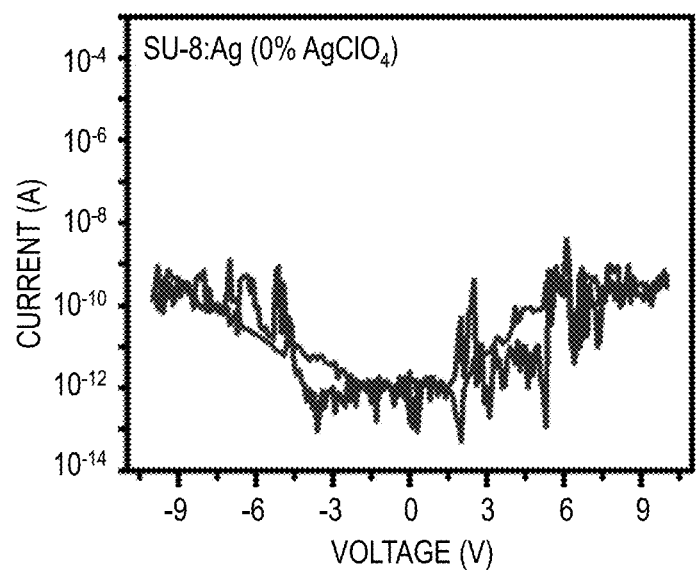
FIGS. 2A-2D graphically depict typical direct current (DC), cyclic current-voltage (I-V) sweep characteristics of an $Ag/SU-8+AgClO_4/Pt$ cell with varied $AgClO_4$ concentration at 250 milliamperes (mA) current compliance, according to one or more embodiments of the present invention.
Figure 2B:
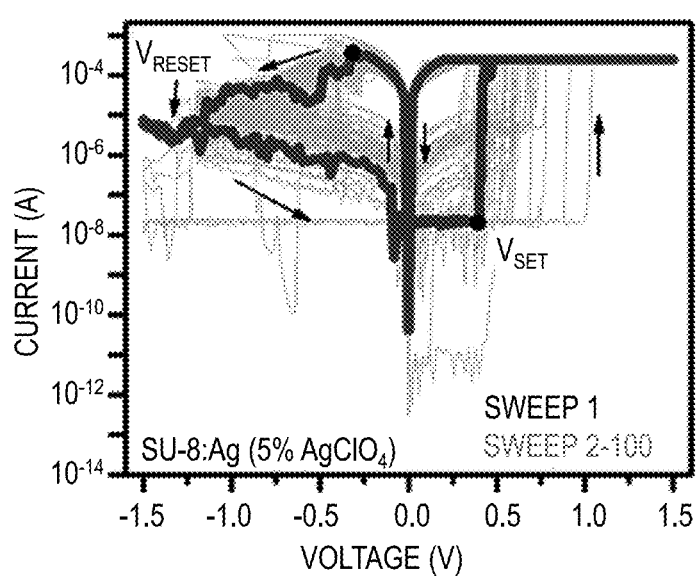
Figure 2C:
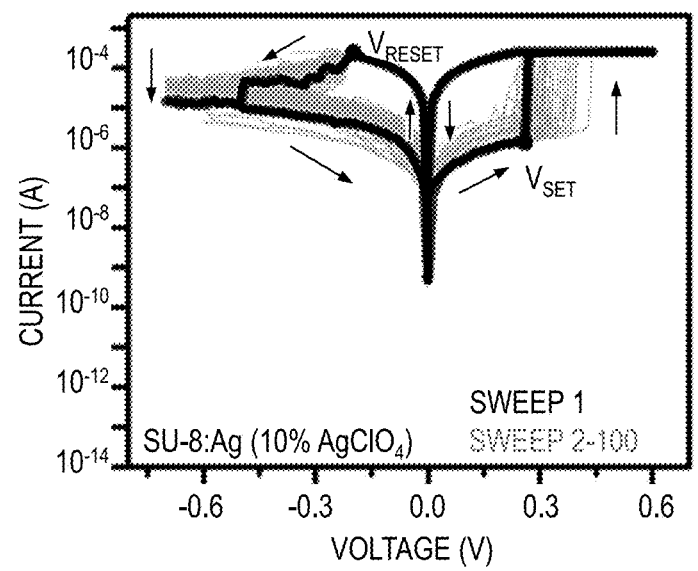
Figure 2D:
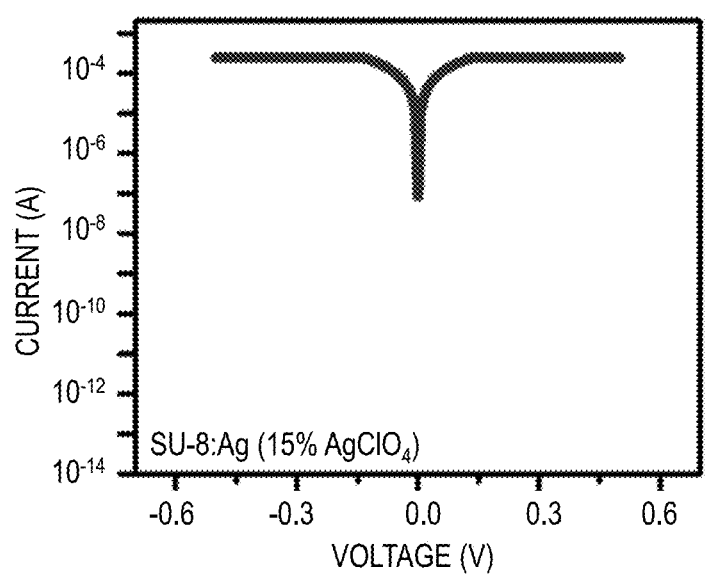
Figure 3A:
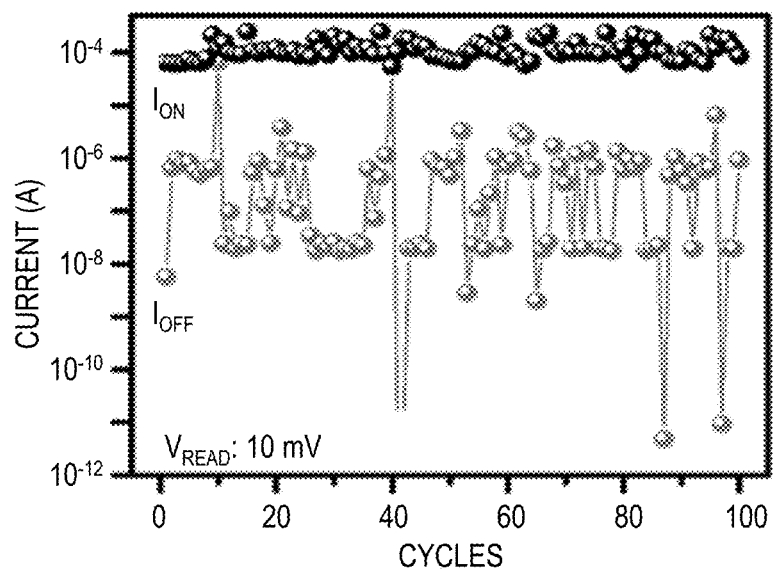
FIGS. 3A-3B graphically depict exemplary distributions of current levels of high-resistive state (HRS) and low-resistive state (LRS) from the first 100 sweeps at 10 millivolt (mV) read voltage for a memory cell with five percent and ten percent $AgClO_4$, respectively, according to one or more embodiments of the present invention.
Figure 3B:
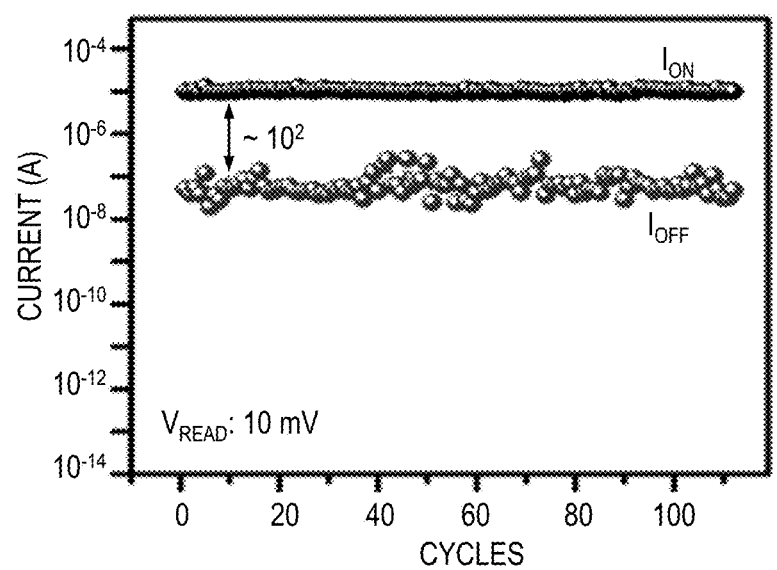
Figure 3C:
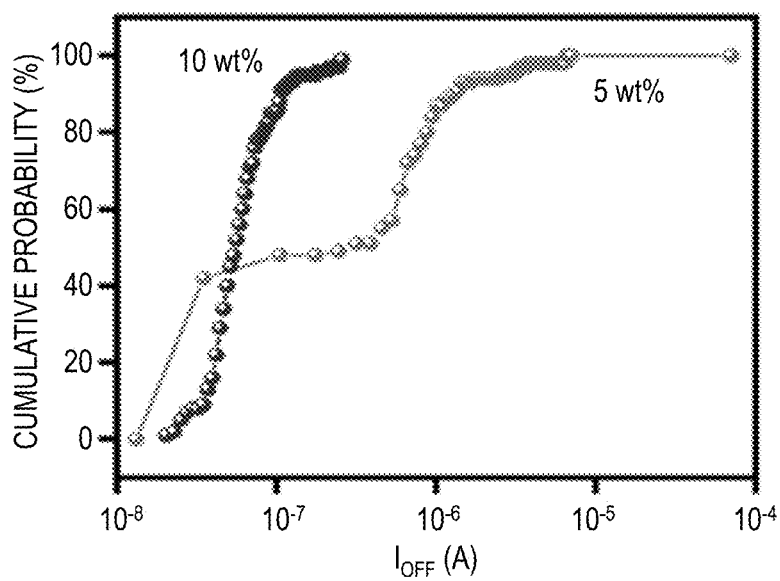
FIG. 3C graphically depicts a cumulative probability distribution comparing HRS current levels for memory cells with 5% and 10% $AgClO_4$, according to one or more embodiments of the present invention.
Figure 3D:
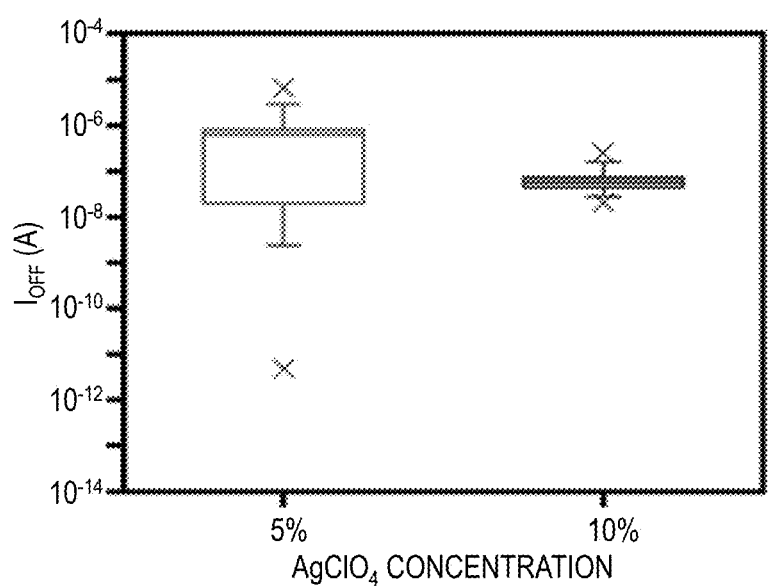
FIG. 3D is a box plot graphically depicting a comparison of HRS current levels for memory cells with five percent and ten percent $AgClO_4$, according to one or more embodiments of the present invention.

FIGS. 3A-3D are graphs depicting certain characteristics relating to the illustrative RRAM cell according to one or more embodiments of the invention, which can be read in conjunction with FIGS. 2A-2D. More particularly, FIGS. 3A and 3B depict distributions of current levels of HRS and LRS from the first 100 sweeps at 10 mV read voltage for the RRAM memory cell with 5 wt % and 10 wt % concentrations of AgClO$_4$ in the SU-8 matrix, respectively; FIG. 3C depicts cumulative probability distribution versus device off-current ($I_{OFF}$) for 5 wt % and 10 wt % SU-8:AgClO$_4$ cells; and FIG. 3D shows a box plot distribution comparing the HRS current levels for 5 wt % and 10 wt % SU-8:AgClO$_4$ cells for the first 100 sweeps (error bar: max and min data, box: standard error, line: average current, 'X': outliers).

As apparent from FIG. 2A, the pure SU-8 RRAM cell without any AgClO$_4$ (i.e., 0 wt %) features low currents (about 1-100 picoamperes (pA)) with no discernable switching action within the ±10 V window. Only when the AgClO$_4$ concentration is increased to about 5 wt % does the SU-8:AgClO$_4$ cell begin to exhibit a bipolar resistive switching (BRS) characteristic at about a ±1.5 V voltage sweep window, as shown in FIG. 2B. However, the cell in FIG. 2B has a large variation in the HRS current level ($I_{OFF}$; see FIG. 3A), indicating that the amount of AgClO$_4$ within the SU-8 matrix of the cell is insufficient to form a stable conductive filament.

With reference to FIG. 2C, at 10 wt % AgClO$_4$ concentration, the SU-8:AgClO$_4$ cell demonstrates a more consistent BRS characteristic within a more narrow required switching voltage window (about ±0.8 V) during 100 repeated switching cycles, which is accompanied by a significantly more consistent cycle-to-cycle $I_{OFF}$ (see FIG. 3B), featured by a steep rise of cumulative probability distribution and a drastic reduction in statistical variation compared with the 5 wt % SU-8:AgClO$_4$ case (see FIGS. 3C-3D), which is an indication of a stable filament formation.

While the optimized base SU-8:Ag hybrid RRAM device exhibits consistent off-current during repeated DC switching cycles, it still features a large variation in the device set and reset voltages, as evident in FIG. 2C. This is most likely attributable to a non-uniform distribution of randomly mixed AgClO$_4$ in the SU-8 matrix affecting a stochastic formation and a disruption of conductive filaments in the hybrid RRAM device.

Figure 4A:
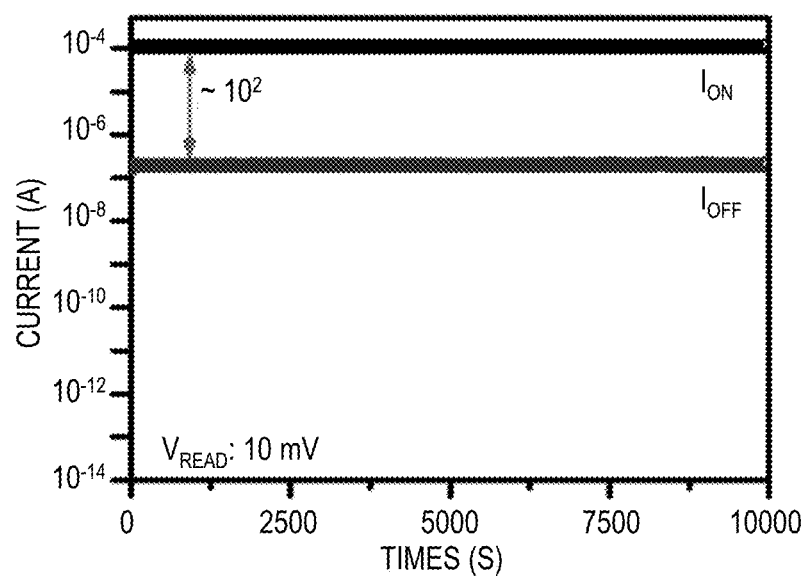
FIGS. 4A-4B are graphs respectively depicting data retention characteristics of the exemplary RRAM cell comprising 10 wt % $SU-8:AgClO_4$ at 10 mV read voltage, and device-to-device variation in the HRS and LRS current levels of the $SU-8:AgClO_4$ (10 wt %) cell, averaged from the first 10 sweeps for 10 different devices, according to one or more embodiments of the present invention.
Figure 4B:
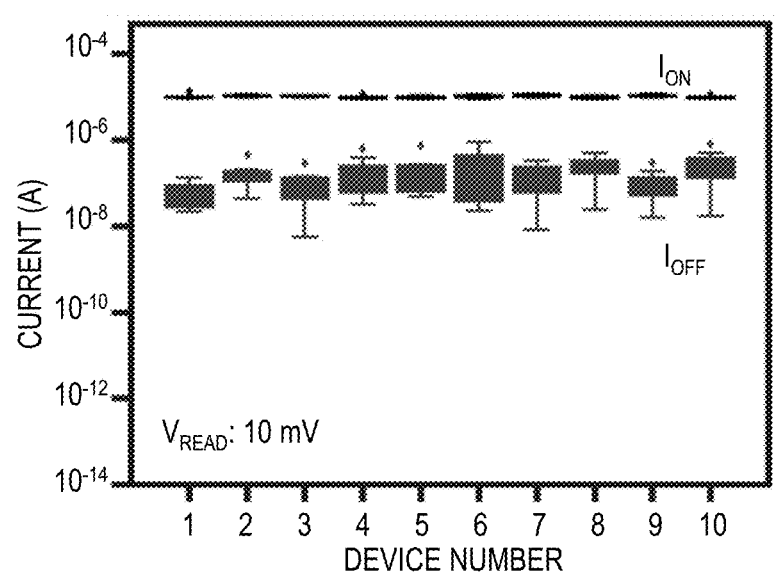

FIGS. 4A and 4B are graphs respectively depicting data retention characteristics of the exemplary RRAM cell comprising 10 wt % SU-8:AgClO$_4$ at 10 mV read voltage, and device-to-device variation in the HRS and LRS current levels of the SU-8:AgClO$_4$ (10 wt %) cell, averaged from the first 10 sweeps for 10 different devices (error bar: max and min data, box: standard error, line: average current), according to one or more embodiments of the invention. With reference to FIGS. 4A and 4B, it is evident that this illustrative scenario achieves an excellent retention of both HRS and LRS during 100 reading cycles (using 10 mV reading voltage) with about 200 on-off ratio (FIG. 4A) with a temporal variation of 64% and 6.7% for HRS and LRS current levels respectively (FIG. 4B), according to one or more embodiments of the invention. Reasonable spatial variation among ten separately tested devices (FIG. 4B) with 40.9% and 2.78% for HRS and LRS current levels was achieved.

The experimental results shown in FIGS. 2A-2D, 3A-3D, 4A and 4B not only confirm that the optimized base SU-8:AgClO$_4$ is an effective resistive switching medium for RRAM, but also evidences the importance of controlling filament formation for mitigating switching stochasticity. Meanwhile, at 15 wt % concentration of AgClO$_4$ in the SU-8 matrix, no switching was observed in the device due to an electrical short, as shown in FIG. 2D, which was likely caused by the formation of a percolative conductive network.

In accordance with one or more embodiments of the invention, the incorporation of molecular AlO$_x$ network by VPI into the SU-8:AgClO$_4$ matrix not only significantly suppresses the variation of device switching parameters, including $V_{SET}$ and $V_{RESET}$, but also provides a mechanism for controlling the switching characteristics of the device by adjusting (i.e., tuning) the amount of infiltrated AlO$_x$.

Figure 5:
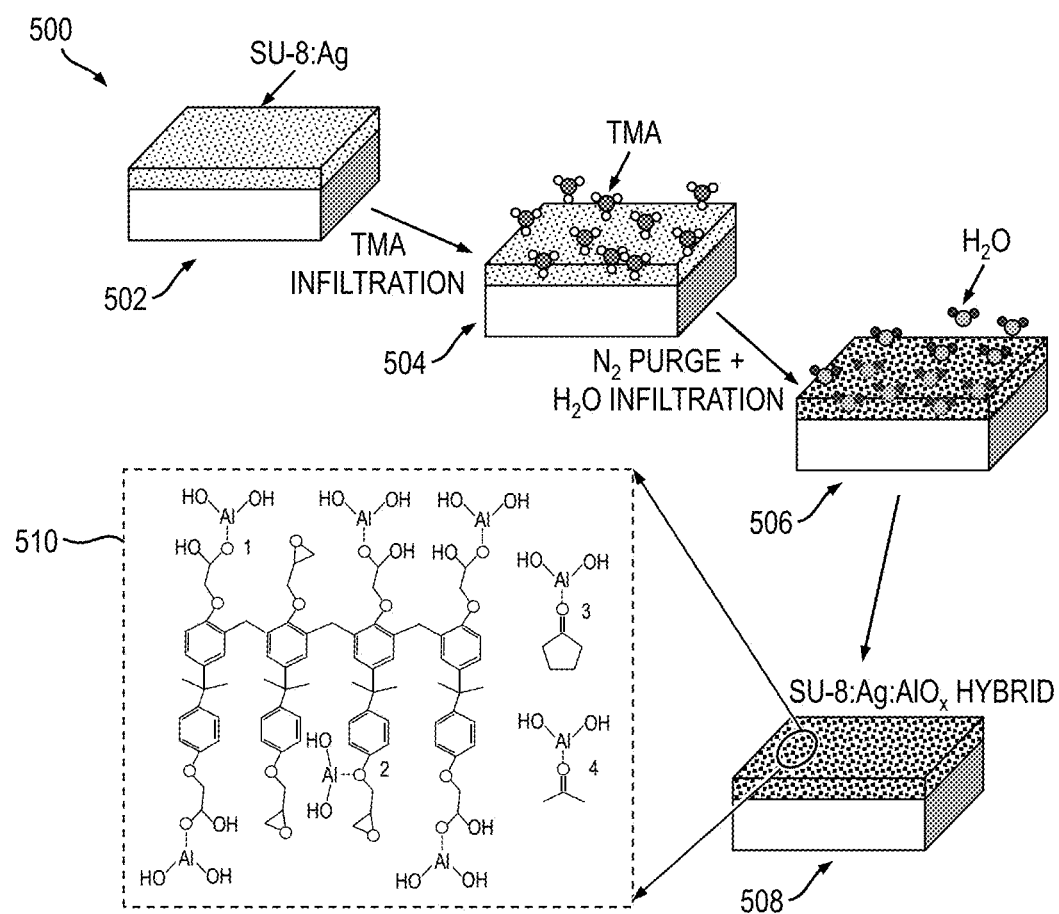
FIG. 5 is a process flow diagram conceptually depicting at least a portion of an exemplary method for performing infiltration of $AlO_x$ into the $SU-8:AgClO_4$ matrix, according to one or more embodiments of the present invention.

By way of example only and without limitation, the infiltration of AlO$_x$ into the SU-8:AgClO$_4$ matrix is preferably implemented, in one or more embodiments, to form an SU-8:AgClO$_4$:AlO$_x$ hybrid structure. More particularly, FIG. 5 is a process flow diagram conceptually depicting at least a portion of an exemplary method 500 for performing infiltration of AlO$_x$ into the SU-8:AgClO$_4$ matrix, according to one or more embodiments of the invention. In step 502, SU-8:AgClO$_4$ (10 wt %) is spin cast at 1500 RPM for about 45 seconds resulting in the formation of about a 30 nm thick film. Next, sequential exposure of the SU-8:AgClO$_4$ film to trimethyl aluminum (TMA) and to water vapor is performed in steps 504 and 506, respectively, under a static vacuum in a commercial atomic layer deposition (ALD) system, with an intermediate nitrogen (N$_2$) purge step between the two precursor exposure steps. During the infiltration process, sequential half-cycles of TMA infiltration (step 504) and water infiltration (step 506) are used to hybridize the SU-8:AgClO$_4$ film with alumina to obtain the SU-8:AgClO$_4$:AlO$_x$ hybrid structure in step 508. The precursors possibly could bind to either carbonyl or ether functional groups of the SU-8 molecule or other residual molecules that could remain within the hybrid, as conceptually shown in the illustrative organic diagram 510 in FIG. 5.

During the infiltration process, Lewis-acidic TMA molecules are expected to bind to Lewis-basic moieties available in SU-8, such as ethylene oxide (EO) groups (see D. Yi, et al., "Infiltration Synthesis of Diverse Metal Oxide Nanostructures from Epoxidized Diene-Styrene Block Copolymer Templates," *ACS Applied Polymer Materials* 2019, 1 (4), pp. 672-683, which is incorporated by reference herein in its entirety) or residual solvent molecules (see X. Ye, et al., "Effects of Residual Solvent Molecules Facilitating the Infiltration Synthesis of ZnO in a Nonreactive Polymer," *Chemistry of Materials* 2017, 29 (10), pp. 4535-4545, which is incorporated by reference herein in its entirety), and be converted to AlOH/AlO$_x$ during the following water vapor exposure step 506. A similar incorporation of metal oxides in SU-8 by VPI may lead to novel hybrid properties, including ultrahigh elastic energy storage capacity and enhanced gravimetric chemical sensing capability, as well as the arbitrary patterning of metal oxide nanostructures and devices, as will be understood by those skilled in the relevant art.

The $AlO_x$ infiltration into the SU-8:$AgClO_4$ hybrid structure results in a significant beneficial impact on device operation scheme, $I_{OFF}$, on-off ratio, and, more importantly, variability of device switching parameters, as a function of the amount of infiltrated $AlO_x$, which in one or more embodiments is controlled by precursor exposure duration (e.g., about 100 s to 400 s). For instance, it can be experimentally shown that while the base SU-8:$AgClO_4$ device did not require a separate electroforming step for the formation of conductive filaments, the 100 s $AlO_x$-infiltrated SU-8:$AgClO_4$ device did so under 100 microamperes (μA) compliance current (see FIG. 6A, where the $I_{OFF}$ at 10 mV—before the electroforming step—was only sub-100 pA regardless of the $AlO_x$ infiltration amount (i.e., duration), in contrast to the $I_{OFF}$ of greater than 10 nanoamperes (nA) in the base SU-8:$AgClO_4$ hybrid without infiltration).

Figure 6A:
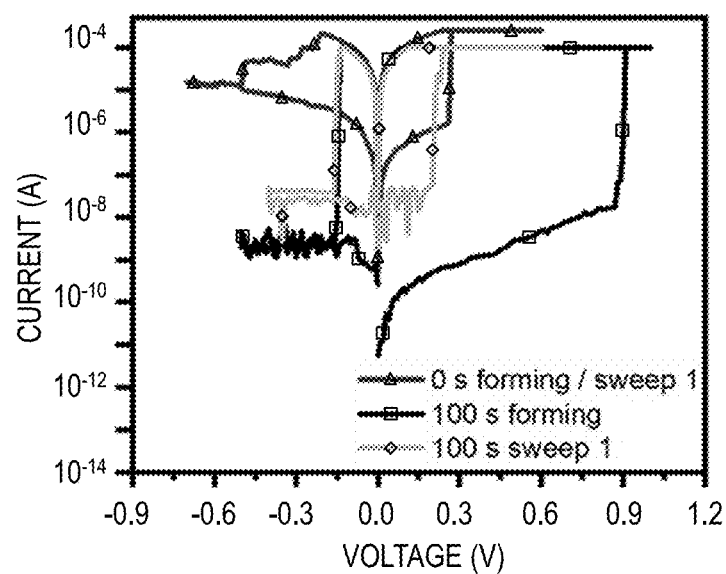
FIGS. 6A-6C are graphs depicting exemplary forming sweeps for 100 s, 200 s and 400 s $AlO_x$ infiltration duration, respectively, according to one or more embodiments of the invention.
Figure 6B:
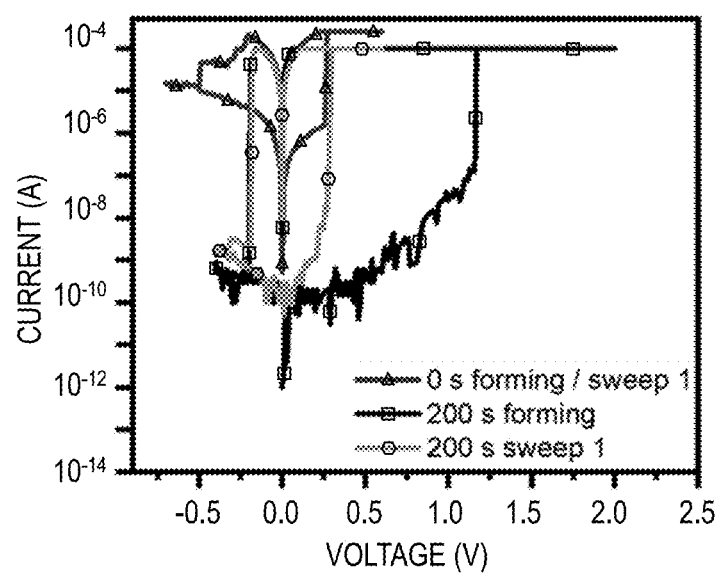
Figure 6C:
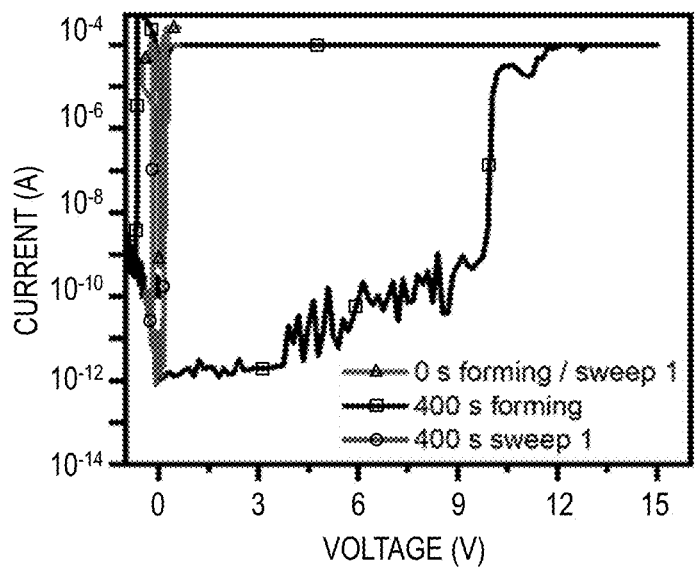
Figure 6D:
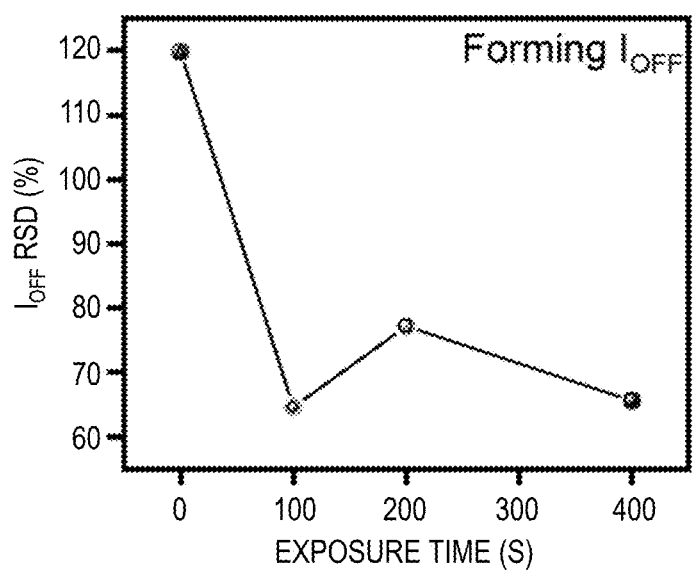
FIG. 6D is a graph depicting an exemplary relative standard deviation (RSD) of HRS current levels for all conditions of infiltration from 10 different devices for each condition, according to one or more embodiments of the invention.

FIGS. 6A-6C are graphs depicting exemplary forming sweeps for SU-8:$AgClO_4$:$AlO_x$ hybrid structure prepared using 100 s, 200 s and 400 s $AlO_x$ infiltration duration, respectively, and FIG. 6D is a graph depicting an exemplary relative standard deviation (RSD) of HRS current levels for all conditions of infiltration from 10 different devices for each condition, according to one or more embodiments of the invention. The RSD, which represents the standard deviation normalized by mean value of $I_{OFF}$ (forming process), was estimated from 10 different devices (spatial variation). The first measurable sign of the device switching characteristics affected by the $AlO_x$ infiltration can be observed in the composition prepared by about 100 s exposure, as shown in FIG. 6D. RSD of the HRS current levels for all conditions of infiltration decreased to 65% from 120% after 100 s of $AlO_x$ infiltration; RSD for 200 s and 400 s was also reduced to 77% and 66%, respectively, for the $I_{OFF}$ current levels (forming process).

Figure 7A:
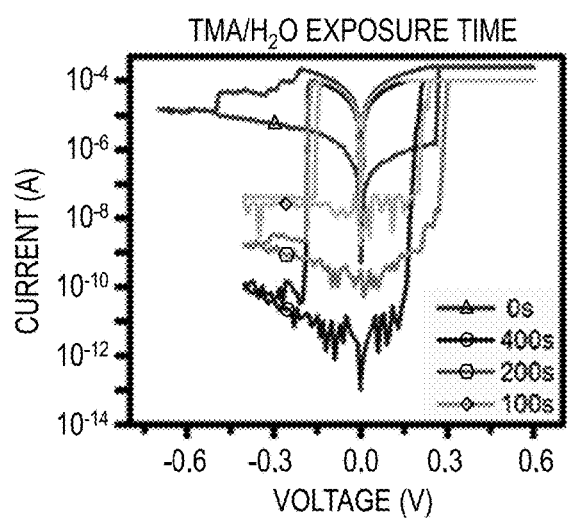
FIG. 7A are exemplary I-V curves for an $Ag/SU-8+AgClO_4+AlO_x/Pt$ cell with varying precursor exposure times of 0 s, 100 s, 200 s and 400 s, according to one or more embodiments of the present invention.
Figure 7B:
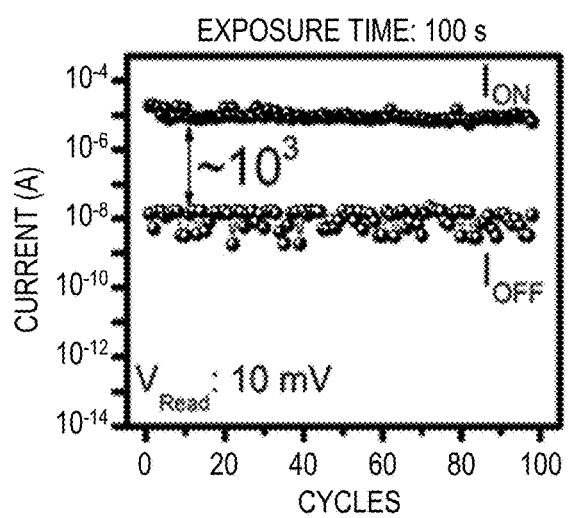
FIGS. 7B-7D are exemplary graphs depicting HRS and LRS current levels obtained from 100 consecutive sweeps for 100 s, 200 s, and 400 s, respectively, according to one or more embodiments of the present invention.
Figure 7C:
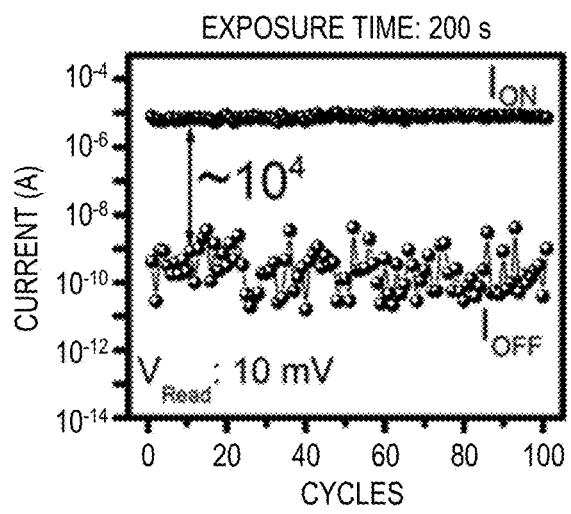
Figure 7D:
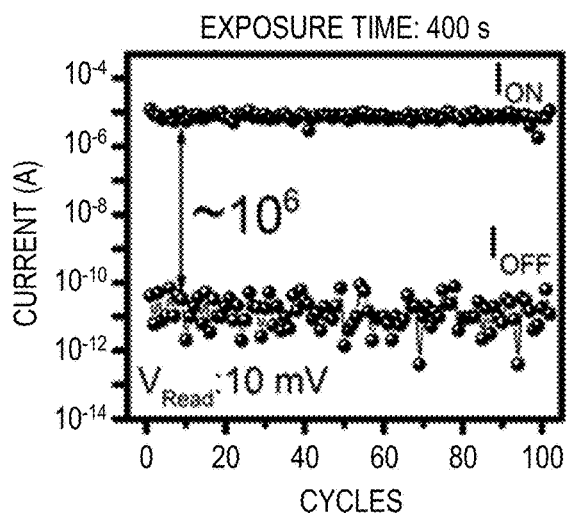

In the meantime, the $I_{OFF}$ of the SU-8:$AgClO_4$ memory cell after the electroforming process decreased as a function of $AlO_x$ infiltration amount (as may be measured by exposure duration) as clearly visible in the representative DC switching I-V characteristics and the $I_{OFF}$ and LRS current level ($I_{ON}$) obtained at 10 mV reading bias during 100 DC switching cycles. More particularly, with reference to FIGS. 7A-7D are exemplary I-V curves for an Ag/SU-8+$AgClO_4$+$AlO_x$/Pt cell with varying precursor exposure times of 0 s, 100 s, 200 s and 400 s (FIG. 7A); HRS and LRS current levels obtained from 100 consecutive sweeps for 100 s (FIG. 7B), 200 s (FIG. 7C) and 400 s (FIG. 7D); cumulative probability distribution of HRS current levels for 0 s, 100 s, 200 s, and 400 s infiltration duration (FIG. 7E); and RSD of HRS current levels as a function of exposure time (FIG. 7F), according to one or more embodiments of the invention.

Specifically, as shown in FIG. 7A, $I_{OFF}$ decreased from about 100 nA down to about 10 pA as the $AlO_x$ infiltration duration increased from 0 s to 400 s, thus by approximately a decade decrease in $I_{OFF}$ per 100 s increase in $AlO_x$ infiltration duration. Since the $I_{ON}$ is dictated by the prescribed current compliance (100 mA), the decreasing $I_{OFF}$ also leads to a commensurate increase in the device on-off ratio, from about 100 for the base SU-8:$AgClO_4$ device without infiltration (i.e., 0 s), up to about $10^6$ at 400 s $AlO_x$ infiltration duration, thus marking a four-decade increase in device on-off ratio.

Figure 7E:
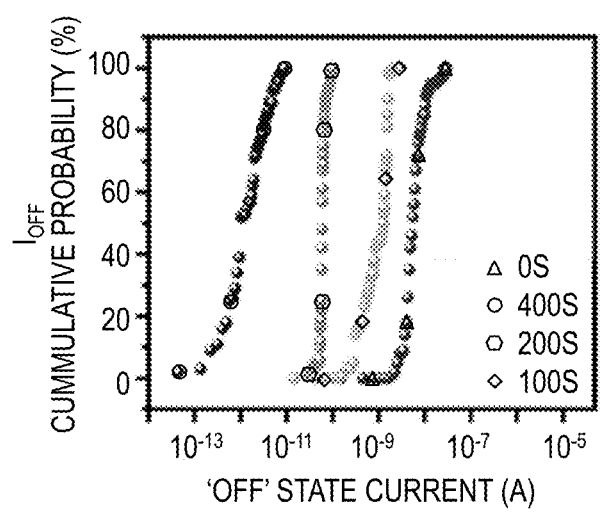
FIG. 7E are exemplary graphs depicting cumulative probability distribution of HRS current levels for 0 s, 100 s, 200 s, and 400 s infiltration duration, according to one or more embodiments of the present invention.
Figure 7F:
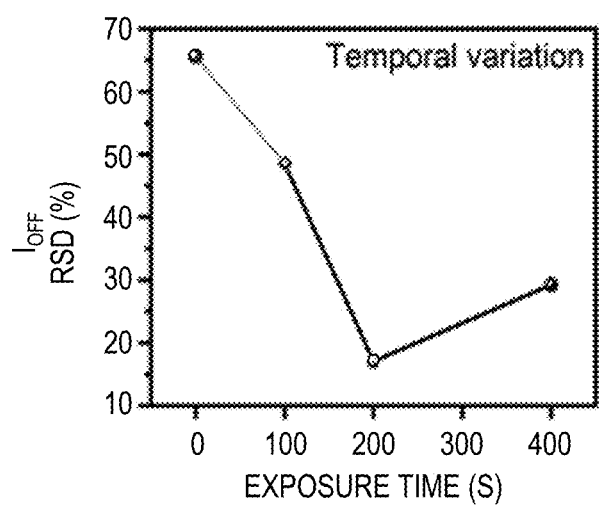
FIG. 7F is a graph depicting exemplary temporal variation (e.g., RSD) of HRS current levels as a function of exposure time, according to one or more embodiments of the present invention.

As previously alluded to, $AlO_x$ infiltration, under an optimized amount, reduced the variation in switching parameters of the hybrid SU-8:$AgClO_4$ memory device. For instance, the cumulative probability distribution of $I_{OFF}$ measured during 100 DC switching cycles provides a visual confirmation of the decreasing $I_{OFF}$ as well as its varying RSD with increasing $AlO_x$ infiltration duration (FIGS. 7E-7F). Specifically, with reference to FIG. 7F, RSD decreased to 48.6% at 100 s $AlO_x$ infiltration duration from 65.6% of the base hybrid SU-8:$AgClO_4$ device (without $AlO_x$ infiltration), and decreased down to 17% at 200 s infiltration duration, thus achieving a 74% decrease in $I_{OFF}$ variation compared with the non-infiltrated base device. However, extending the $AlO_x$ infiltration duration to 400 s increased the RSD of $I_{OFF}$ to 29.3%, achieving a 55.3% decrease in $I_{OFF}$ variation compared with the non-infiltrated base hybrid SU-8:$AgClO_4$ device. Hence, the reduction in $I_{OFF}$ variation is not entirely linear with increasing $AlO_x$ infiltration duration. In this exemplary scenario, an $AlO_x$ infiltration duration of 200 s produces more optimized results compared to either 100 s or 400 s of $AlO_x$ infiltration.

Figure 8A:
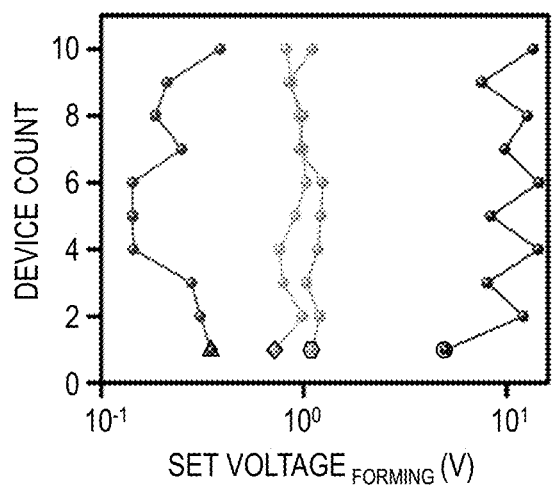
FIG. 8A are graphs depicting exemplary $V_{SET}$ voltages required for initial electroforming of a conductive filament ($V_{SET,forming}$) measured for 10 different devices at $AlO_x$ infiltration duration times of 0 s (i.e., non-infiltrated), 100 s, 200 s and 400 s, according to one or more embodiments of the present invention.

The $V_{SET}$ and $V_{RESET}$ of RRAM are other important device switching parameters whose stochastic variation is desired to be controlled and reduced. $AlO_x$ infiltration into the SU-8:$AgClO_4$ hybrid also has a significant impact on $V_{SET}$ and $V_{RESET}$, reducing their variability. FIG. 8A are graphs depicting exemplary $V_{SET}$ voltages required for initial electroforming of a conductive filament ($V_{SET,forming}$) measured for 10 different devices at $AlO_x$ infiltration duration times of 0 s (i.e., non-infiltrated), 100 s, 200 s and 400 s, according to one or more embodiments of the invention; FIG. 8C are graphs depicting $V_{SET,forming}$ variability among the 10 measured devices in FIG. 8A. With reference to FIGS. 8A and 8C, it is demonstrated that at the outset, the $V_{SET,forming}$ voltage increases fairly linearly with increasing $AlO_x$ exposure duration, from about 0.2 V for the non-infiltrated base SU-8:$AgClO_4$ device, to about 1 V at either 100 s or 200 s $AlO_x$ infiltration duration, and finally up to about 10 V after 400 s $AlO_x$ infiltration. The drastic increase in $V_{SET,forming}$ at 400 s $AlO_x$ infiltration duration implies that the infiltration of a more robust and continuous $AlO_x$ network within the SU-8 matrix interferes with the initial formation of Ag conductive filaments.

Figure 8B:
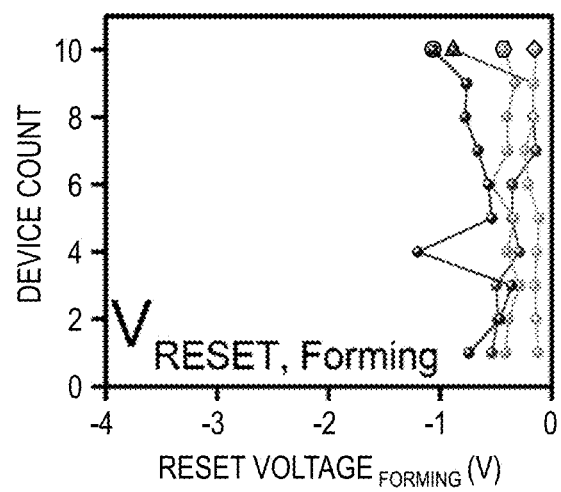
FIG. 8B are graphs depicting exemplary $V_{RESET}$ voltages required immediately after the initial electroforming ($V_{RESET,forming}$) measured for 10 different devices at $AlO_x$ infiltration duration times of 0 s (i.e., non-infiltrated), 100 s, 200 s and 400 s, according to one or more embodiments of FIG. 8C are graphs depicting exemplary $V_{SET,forming}$ variability among the 10 measured devices shown in FIG. 8A.
Figure 8C:
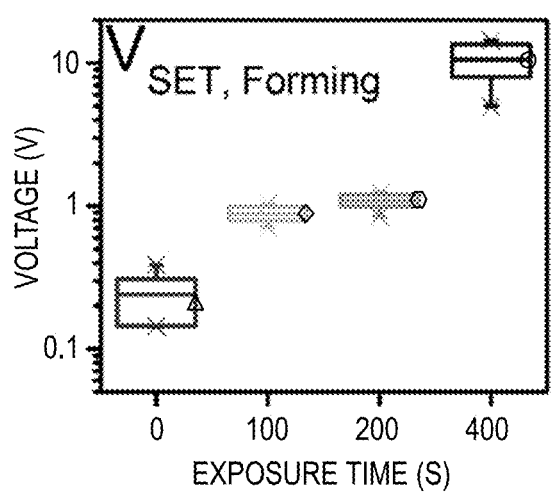
FIG. 8D are graphs depicting exemplary $V_{RESET,forming}$ variability among the 10 measured devices shown in FIG. 8B.
FIGS. 8E and 8F are graphs depicting exemplary standard deviation for $V_{SET,forming}$ and $V_{RESET,forming}$, respectively, as a function of $AlO_x$ infiltration duration, according to one or more embodiments of the present invention.
Figure 8D:
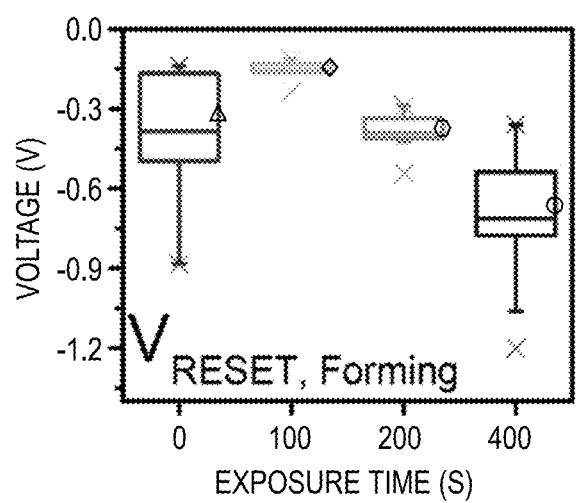

Similarly, FIG. 8B are graphs depicting exemplary $V_{RESET}$ voltages required immediately after the initial electroforming ($V_{RESET,forming}$) measured for 10 different devices at $AlO_x$ infiltration duration times of 0 s (i.e., non-infiltrated), 100 s, 200 s and 400 s, according to one or more embodiments of the invention; FIG. 8D are graphs depicting $V_{RESET,forming}$ variability among the 10 measured devices in FIG. 8B. With reference to FIGS. 8B and 8D, it is demonstrated that $V_{RESET,forming}$ increased in magnitude, but modestly from around −0.4 V to −0.7 V after 400 s $AlO_x$ infiltration.

Figure 8E:
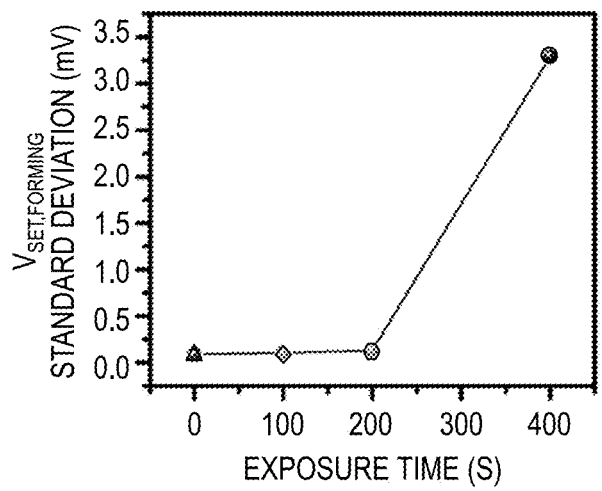
Figure 8F:
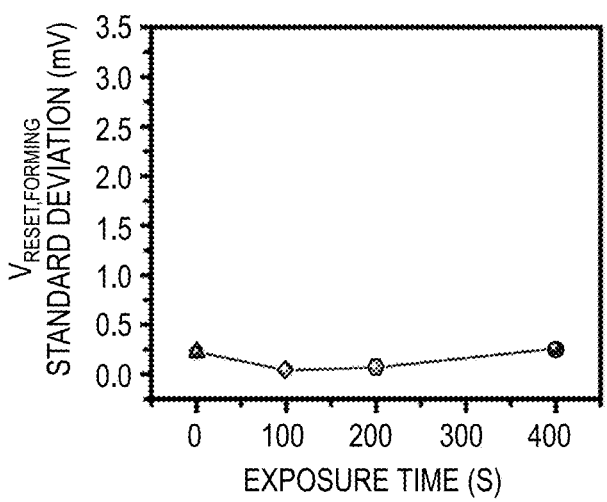

FIGS. 8E and 8F are graphs depicting standard deviation for $V_{SET,forming}$ and $V_{RESET,forming}$, respectively, as a function of $AlO_x$ infiltration duration, according to one or more embodiments of the invention. As apparent from FIG. 8E, the standard deviation for $V_{SET,forming}$ for the device at $AlO_x$ infiltration duration times of 0 s (i.e., non-infiltrated), 100 s and 200 s was less than about 0.25 mV, but for the device at 400 s of $AlO_x$ infiltration duration, the standard deviation for $V_{SET,forming}$ increased substantially to over 3.25 mV. The standard deviation for $V_{RESET,forming}$, by contrast, was fairly consistent for all durations of $AlO_x$ infiltration at about 0.25 mV or less, as shown in FIG. 8F.

Figure 9A:
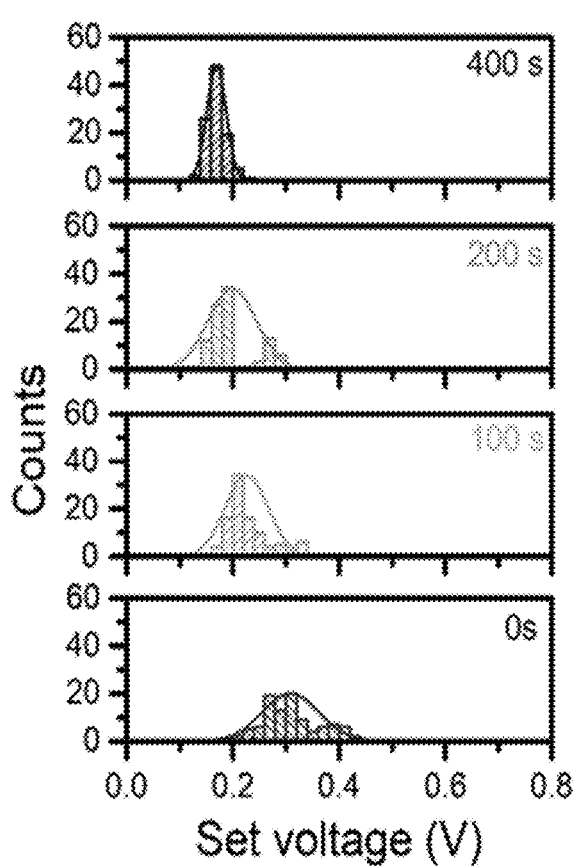
Figure 9B:
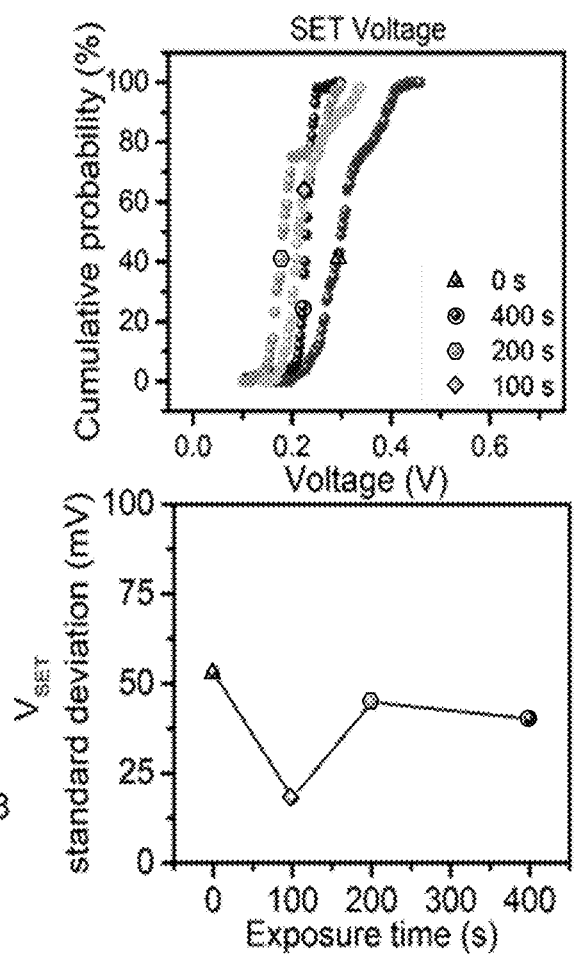

FIGS. 9A and 9C are histograms depicting exemplary SET and RESET voltage variation, respectively, for devices having $AlO_x$ infiltration times varying between 0 s and 400 s, according to one or more embodiments of the invention; FIGS. 9B and 9D are graphs depicting cumulative probability distribution and corresponding standard deviation in SET voltage ($V_{SET}$) and RESET voltage ($V_{RESET}$), respectively, for devices having $AlO_x$ infiltration times varying between 0 s and 400 s, according to one or more embodiments of the invention.

Intriguingly, as an unexpected result, after the first electroforming cycle of the $AlO_x$-infiltrated SU-8:$AgClO_4$ device, the actual $V_{SET}$ and $V_{RESET}$ required for the following memory device operation decreased in magnitude with increasing $AlO_x$ infiltration duration, which was accompanied by drastically reduced cycle-to-cycle variations. For example, as evident in FIG. 9A, $V_{SET}$ measured during 100 DC switching cycles decreased from about 0.32 V down to about 0.15 V, with seemingly reduced width of $V_{SET}$ distribution, as the $AlO_x$ infiltration duration time extended from 0 s (i.e., non-infiltrated) to 400 s. The corresponding rise of cumulative probability distribution was therefore rendered steeper by the $AlO_x$ infiltration, especially for 400 s duration, as evident from FIG. 9B. Consequently, the cycle-to-cycle standard deviation of $V_{SET}$ is reduced to about 40 mV after 400 s of $AlO_x$ infiltration, compared with about 53 mV for the non-infiltrated (i.e., 0 s) base SU-8:$AgClO_4$ device, thus representing about a 25% reduction in the $V_{SET}$ variability.

The $AlO_x$ infiltration also suppressed variability in $V_{RESET}$ significantly, as shown in FIG. 9C. It not only eliminated the bimodal distribution of $V_{RESET}$ of the base SU-8:$AgClO_4$, which is caused by the two-step reset process required for the base device operation, but also significantly reduced the standard deviation of $V_{RESET}$ by about 70%, from about 88 mV for the base SU-8:$AgClO_4$ device to about 25 mV after $AlO_x$ infiltration, regardless of the $AlO_x$ infiltration duration, as evident from FIG. 9D.

An important, emerging beneficial function of RRAM is its use as an artificial, analog synaptic switching device for low-power neuromorphic computing applications. (See, e.g., D. Marković, et al., "Physics for Neuromorphic Computing," *Nature Reviews Physics* 2020, 2 (9), pp. 499-510; and K. Roy, et al., "Towards Spike-based Machine Intelligence with Neuromorphic Computing," *Nature* 2019, 575 (7784), pp. 607-617). Such synaptic devices should be adapted to support a multi-level resistive switching behavior to store more than two data levels in one cell and thereby increase memory capacities.

Figure 10A:
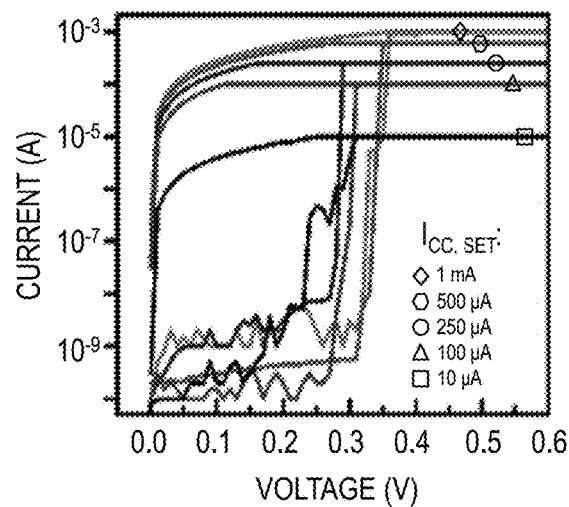
FIG. 10A are graphs conceptually depicting exemplary I-V characteristics during the setting process of an RRAM device formed in accordance with one or more embodiments of the invention under different compliance currents of 1 mA, 500 μA, 250 μA, 100 μA and 10 μA.
Figure 10B:
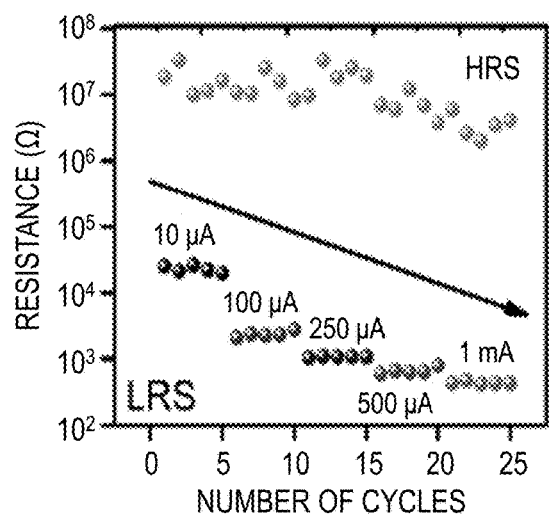
FIG. 10B are graphs conceptually depicting exemplary multi-level resistance states associated with the different compliance currents used in FIG. 10A for the exemplary RRAM device.
Figure 10C:
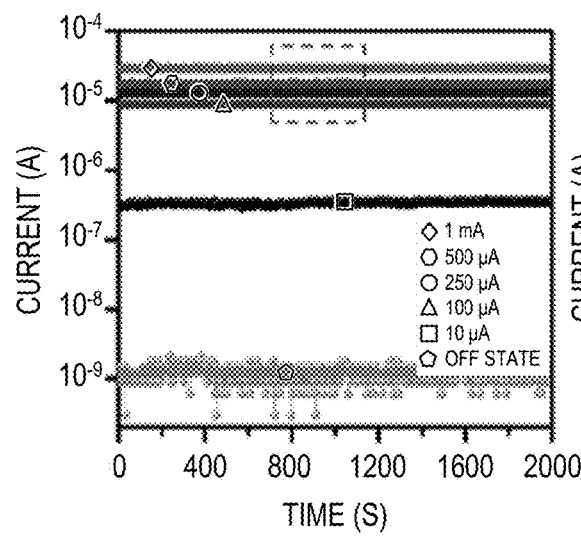
FIGS. 10C and 10D conceptually depict data retention characteristics of the exemplary RRAM device for different compliance currents, according to one or more embodiments of the present invention.
Figure 10D:
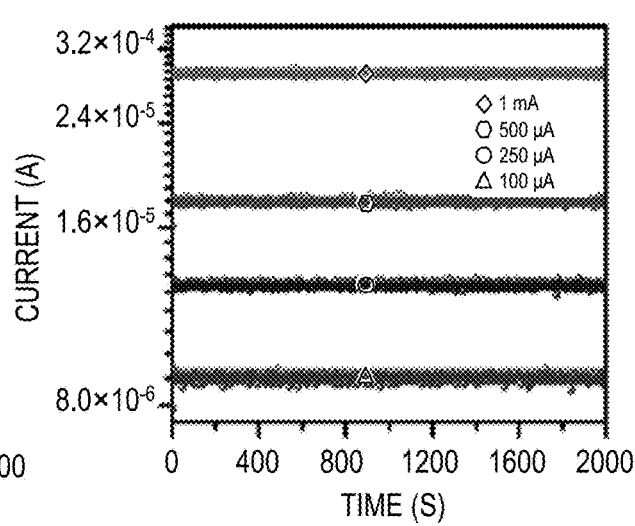

By way of example only and without limitation, FIG. 10A are graphs conceptually depicting illustrative current-voltage (I-V) characteristics during the setting process of an RRAM device formed in accordance with one or more embodiments of the invention under different compliance currents of 1 mA, 500 µA, 250 µA, 100 µA and 10 µA; FIG. 10B depicts multi-level resistance states with the different compliance currents used in FIG. 10A; and FIG. 10C-10D conceptually depict data retention characteristics of the exemplary RRAM device for different compliance currents, according to one or more embodiments of the invention.

With reference to FIG. 10A, it is confirmed that the $AlO_x$-infiltrated hybrid SU-8:$AgClO_4$ device can support multi-level switching by controlling the current compliance ($I_{CC}$) imposed during device set operations. In particular, five distinct LRS levels were obtained by using compliance currents ($I_{CC}$) of 1 mA, 500 µA, 250 µA, 100 µA or 10 µA in a 200 s $AlO_x$-infiltrated hybrid SU-8:$AgClO_4$ RRAM cell. The resistance of HRS was nearly unaffected by different $I_{CC}$ values, but the LRS resistance increased with decreasing $I_{CC}$, demonstrating the tunability of the LRS level during the set process, consequently leading to multi-level low-resistance states.

To confirm the reliability of multi-level switching, the number of DC switching cycles during which the $AlO_x$-infiltrated hybrid SU-8:$AgClO_4$ RRAM device was operating stably was measured. The resistance states, determined by using 10 mV reading bias under various $I_{CC}$ values from 1 mA, 500 µA, 250 µA, 100 µA, and 10 µA, confirmed that the multi-level switching was achieved with five distinctive LRS data levels with a single HRS level that was slightly fluctuating, as apparent from FIG. 10B. The stable retention of these data states, read by 10 mV bias, was further identified; the device could well distinguish the five LRS levels without any sign of degradation within the tested, 2000 s reading operation duration (see FIGS. 10C and 10D), thus demonstrating the multi-level switching combined with an excellent data retention endurance of the infiltrated hybrid RRAM cell according to one or more embodiments of the invention.

Figure 11A:
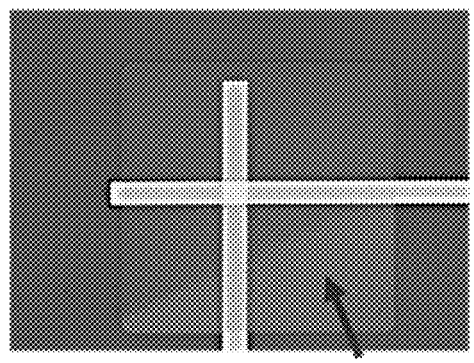
FIG. 11A is an optical image depicting a top plan view of at least a portion of an exemplary cross-linked RRAM device, according to one or more embodiments of the present invention.
Figure 11B:
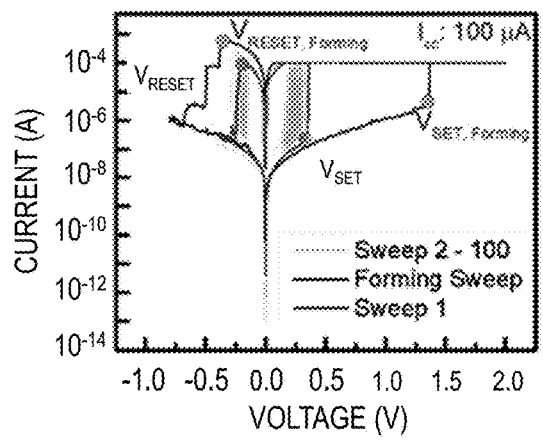
FIG. 11B are graphs depicting exemplary DC switching performance of the illustrative cross-linked RRAM device shown in FIG. 11A, according to one or more embodiments of the present invention.

To demonstrate the patterning capability of a SU-8:$AgClO_4$:$AlO_x$ hybrid RRAM cell according to aspects of the invention and evaluate its memory performance, the patterned hybrid memory cell was fabricated by incorporating photo acid generator into the SU-8:$AgClO_4$ solution in order to cross-link the matrix when exposed to UV light (see experimental details for more information). The solution was spin-cast on top of a Pt bottom electrode and was UV cross-linked using a shadow mask to define/confine the switching medium on the bottom electrode. Following the crosslinking step, the patterned hybrid was infiltrated with alumina at 100 s exposure, in this illustrative embodiment, before patterning an Ag top electrode using a shadow mask. FIG. 11A is an optical image depicting a top plan view of the final device, according to one or more embodiments of the invention; exemplary DC switching performance of the cross-linked device shown in FIG. 11A is depicted in FIG. 11B.

Figure 11C:
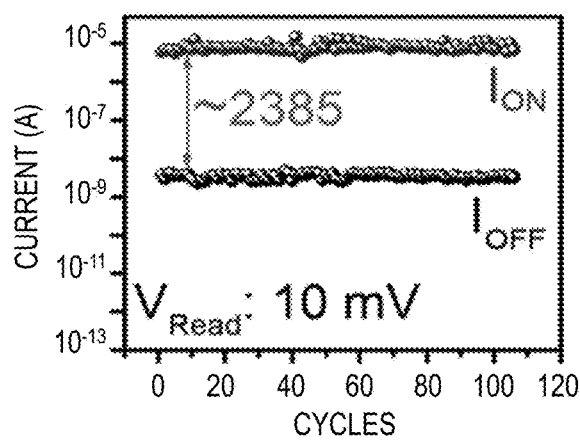
FIG. 11C conceptually depicts exemplary off- and on-state current levels for the illustrative cross-linked RRAM device shown in FIG. 11A, according to one or more embodiments of the present invention.
Figure 11D:
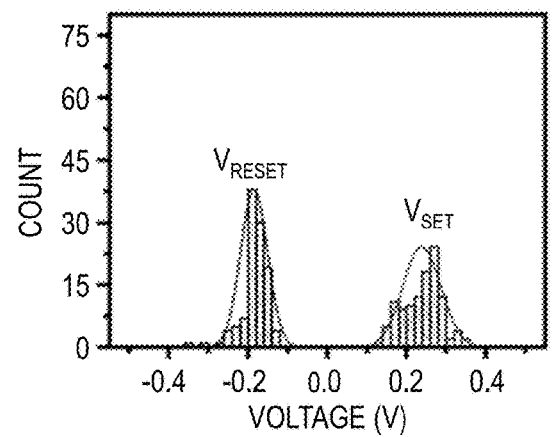
FIG. 11D are histograms depicting exemplary temporal variations in the set and reset voltages for the cross-linked device shown in FIG. 11A, according to one or more embodiments of the present invention.

Similar to the uncross-linked device with 100 s of $AlO_x$ infiltration, an electroforming step was required, using a voltage of about 1.5 V. After the electroforming step, the device could be operated for 100 continuous sweeps. The off- and the on-state current levels were uniform (RSD for the $I_{OFF}$ was about 14.5% and $I_{ON}$ was about 21%), and an on/off ratio was slightly larger but in the same order as that of the uncross-linked device, as shown in FIG. 11C, according to one or more embodiments. Temporal variations in the set voltage (0.24±0.049 V) and reset voltage (−0.18±0.033 V) are captured in FIG. 11D.

Figure 11E:
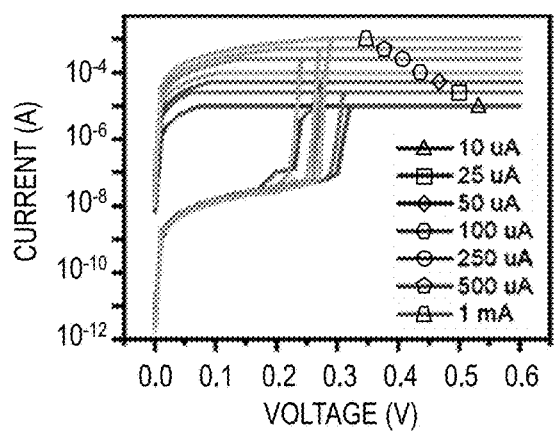
FIGS. 11E and 11F are graphs depicting experimental switching results for the cross-linked hybrid switching medium of the RRAM device shown in FIG. 11A at compliance current amounts varying between about 10 μA to 1 mA, according to one or more embodiments of the present invention.
Figure 11F:
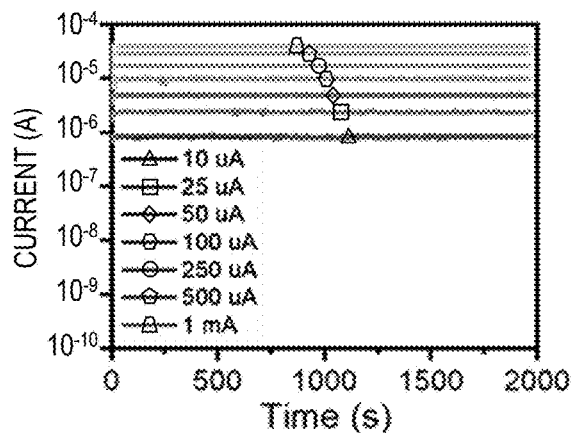
Figure 11G:
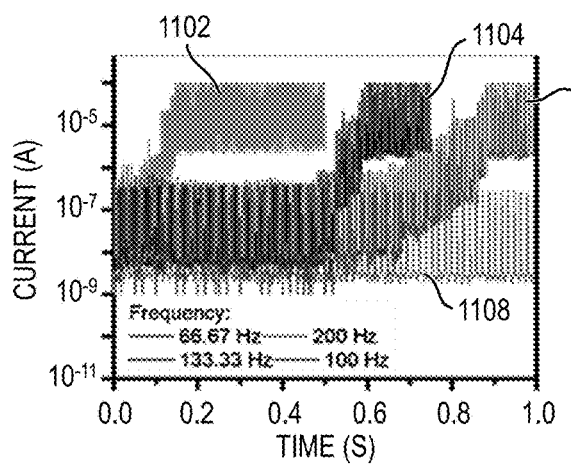
FIGS. 11G and 11H are graphs conceptually demonstrating pair-pulse facilitation (PPF) associated with the cross-linked hybrid switching medium of the RRAM device shown in FIG. 11A by applying a continuous train of identical pulses with amplitude of 0.5 V and varied pulse duration, according to one or more embodiments of the present invention.
Figure 11H:
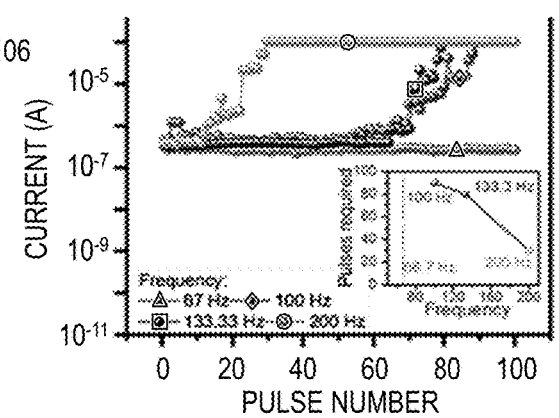

The cross-linked hybrid switching medium formed in accordance with one or more embodiments of the invention showed neuromorphic/artificial synaptic characteristics such as operation at various set compliance currents and pair-pulse facilitation (PPF). As demonstrated through experimentation, the cross-linked hybrid switching medium exhibited consistent DC switching at compliance current amounts varying between about 10 µA to 1 mA, as shown in FIGS. 11E and 11F. By way of example only and without limitation, in order to demonstrate PPF, a continuous train of identical pulses was applied with amplitude of 0.5 V and duration of the pulse was changed between 5, 7.5, 10 and 15 ms, corresponding to frequencies of 200 hertz (Hz), 133.33 Hz, 100 Hz and 66.67 Hz, respectively, as shown in FIGS. 11G and 11H. The devices showed a gradual increase in conductance level for the setting process to occur and this was dependent on the pulse interval, which is analogous to PPF effects in biological synapse.

With reference to FIG. 11G, when the pulse interval is short enough (e.g., about 5 ms (200 Hz)), the setting process occurs very quickly (e.g., after about 30 pulses, in this illustrative embodiment), as indicated by curve 1102 in FIG. 11G. When the pulse interval is increased to 7.5 ms (133.33 Hz), the setting process occurs slower (e.g., after about 80 pulses), as indicated by curve 1104 in FIG. 11G. After increasing the interval to 10 ms (100 Hz), the setting process is further delayed (e.g., after about 90 pulses), as indicated by curve in FIG. 10g). At a pulse interval of 15 ms (66.67 Hz), no setting was observed, as indicated by curve 1108 in FIG. 11G.

The current values at pulse peak are plotted as a function of pulse number in FIG. 11H (and inset). With reference to FIG. 11H, this illustrative plot shows that as the frequency increases, the number pulses required for the SU-8:AgClO$_4$: AlO$_x$ hybrid RRAM device to turn on decreases. The ability to pattern these hybrid cells formed in accordance with embodiments of the invention, combined with the neuromorphic capability they display, demonstrate that they are a good candidate for making large-scale, cross-bar RRAM devices that can be easily fabricated with industry compatible tools and processing methods.

At least a portion of the techniques according to one or more embodiments of the present invention may be implemented in an integrated circuit, either alone or with other integrated circuit elements. In forming integrated circuits, identical die are typically fabricated in a repeated pattern on a surface of a wafer. Each die includes a device or set of multiple devices (RRAM cells) described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having RRAM devices therein formed in accordance with one or more embodiments of the invention, such as, for example, memory devices, computing systems, etc.

An integrated circuit in accordance with aspects of the present disclosure can be employed in essentially any computing system, such as, but not limited to, neuromorphic computing systems, etc. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Furthermore, terms such as "above," "below," "top" and "bottom" as may be used herein are intended to indicate relative positioning of elements or structures to each other as opposed to absolute position. Accordingly, by way of example only and without loss of generality, a top surface of a given structure, when flipped upside down, will become a bottom surface of the structure, and vice versa.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A resistive random access memory (RRAM) device, comprising:
    a plurality of memory cells, each of at least a subset of the memory cells comprising:
    a first electrode formed on a substrate;
    an organic thin film compound mixed with silver perchlorate ($AgClO_4$) salt as a base layer that is incorporated with an amount of inorganic metal oxide molecules, the base layer being formed on at least a portion of an upper surface of the first electrode; and
    a second electrode formed on at least a portion of an upper surface of the base layer;
    wherein resistive switching characteristics of the RRAM device are controlled as a function of a concentration of $AgClO_4$ salt in the base layer; and
    wherein variation of device switching parameters is controlled as a function of the amount of inorganic metal oxide molecules infiltrated in the base layer.

2. The RRAM device according to claim 1, wherein the organic thin film compound comprises SU-8, such that the base layer comprises a SU-8:$AgClO_4$ compound.

3. The RRAM device according to claim 1, wherein the inorganic metal oxide molecules comprise AlOx.

4. The RRAM device according to claim 1, wherein the plurality of memory cells are individually accessible and arranged in an array.

5. The RRAM device according to claim 1, wherein the first electrode comprises at least one of platinum and chromium.

6. The RRAM device according to claim 1, wherein the second electrode comprises at least one of silver, titanium and gold.

7. A resistive random access memory (RRAM) array, comprising:
    a plurality of memory cells, each of at least a subset of the memory cells comprising a nanocomposite thin film layer of SU-8:$AgClO_4$ as a matrixed base layer that is infiltrated with inorganic metal oxide molecules, wherein the inorganic metal oxide molecules form a network in the matrixed base layer that is configured to control resistive switching characteristics as a function of corresponding changes in a concentration of $AgClO_4$ salt in the matrixed base layer to meet prescribed switching parameters of the RRAM device, and wherein a variation of switching parameters associated with the RRAM device is controlled as a function of an amount of metal oxide molecules in the matrixed SU-8:$AgClO_4$ base layer.

8. The RRAM array according to claim 7, wherein the inorganic metal oxide molecules in each of at least a subset of the plurality of memory cells comprise AlOx.

9. The RRAM array according to claim 7, wherein the switching parameters comprise at least one of set and reset voltages, on and off current, and on-off ratio associated with the memory cell.

10. A method for forming a resistive random access memory (RRAM) cell, the method comprising:
    forming a first electrode on at least a portion of an upper surface of a substrate;
    forming an organic thin film compound mixed with silver perchlorate ($AgClO_4$) salt as a base layer on at least a portion of an upper surface of the first electrode;
    incorporating the base layer with a prescribed quantity of inorganic metal oxide molecules using vapor-phase infiltration (VPI);
    forming a second electrode on at least a portion of an upper surface of the base layer;
    controlling resistive switching characteristics of the RRAM cell as a function of a concentration of $AgClO_4$ salt in the base layer; and
    controlling a variation of device switching parameters as a function of an amount of infiltrated metal oxide molecules in the base layer.

11. The method according to claim 10, wherein incorporating the base layer with inorganic metal oxide molecules comprises sequentially exposing the base layer to trimethyl aluminum (TMA) and water vapor precursors under a static vacuum, with an intermediate nitrogen purge being performed between the TMA precursor exposure and the water vapor precursor exposure.

12. The method according to claim 10, wherein the organic thin film compound comprises SU-8, such that the base layer is a SU-8:$AgClO_4$ compound.

13. The method according to claim 10, wherein the inorganic metal oxide molecules comprise AlOx.

14. The method according to claim 10, wherein controlling the variation of device switching parameters comprises selectively controlling the prescribed quantity of inorganic metal oxide molecules in the base layer as a function of infiltration time in accordance with prescribed device switching design criteria.

15. The method according to claim 14, wherein the infiltration time comprises a duration of time that the base layer is exposed to trimethyl aluminum (TMA) and water vapor precursors, with an intermediate nitrogen ($N_2$) purge between the TMA precursor exposure and the water vapor precursor exposure.

16. The method according to claim 10, wherein controlling the resistive switching characteristics of the RRAM cell comprises varying the concentration of $AgClO_4$ salt in the base layer.

17. The method according to claim 16, wherein varying the concentration of $AgClO_4$ salt in the base layer is performed by selectively modifying a weight percentage of $AgClO_4$ relative to a weight percentage of the organic thin film compound in the base layer.

18. A memory device for low-power neuromorphic computing applications, the memory device comprising:
    a plurality of resistive random access memory (RRAM) cells, each of at least a subset of the RRAM cells including a SU-8:$AgClO_4$ matrix base layer configured to regulate resistive switching characteristics in the cell by changing a quantity of $AgClO_4$ salt concentration in the SU-8:$AgClO_4$ matrix base layer, wherein variation of switching parameters of the plurality of RRAM cells is reduced by incorporating a molecular AlOx network in the SU-8:AgClO$_4$ matrix base layer.

* * * * *